(12) United States Patent
Cho et al.

(10) Patent No.: US 12,451,400 B2
(45) Date of Patent: Oct. 21, 2025

(54) SEMICONDUCTOR PACKAGE HAVING IMPROVED HEAT DISSIPATION CHARACTERISTICS

(71) Applicant: SAMSUNG ELECTRONICS CO., LTD., Suwon-si (KR)

(72) Inventors: Youngsang Cho, Seongnam-si (KR); Heeseok Lee, Suwon-si (KR); Yunhyeok Im, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 609 days.

(21) Appl. No.: 17/952,925

(22) Filed: Sep. 26, 2022

(65) Prior Publication Data

US 2023/0207414 A1   Jun. 29, 2023

(30) Foreign Application Priority Data

Dec. 28, 2021  (KR) .................. 10-2021-0189829

(51) Int. Cl.
*H01L 23/367* (2006.01)
*H01L 23/31* (2006.01)
(Continued)

(52) U.S. Cl.
CPC ........ *H01L 23/367* (2013.01); *H01L 23/3128* (2013.01); *H01L 23/481* (2013.01); *H01L 23/5383* (2013.01); *H01L 23/5389* (2013.01); *H01L 25/0657* (2013.01); *H01L 24/05* (2013.01); *H01L 24/16* (2013.01); *H01L 24/32* (2013.01); *H01L 24/73* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01);
(Continued)

(58) Field of Classification Search
CPC .................. H01L 23/367; H01L 23/5389; H01L 23/3128
See application file for complete search history.

(56) References Cited

U.S. PATENT DOCUMENTS 9,054,228 B2   6/2015  Choi et al.
2013/0208426 A1  8/2013  Kim et al.
(Continued)

FOREIGN PATENT DOCUMENTS

KR   10-2015-0065162 A   6/2015

*Primary Examiner* — Dale E Page
*Assistant Examiner* — Wilner Jean Baptiste
(74) *Attorney, Agent, or Firm* — Fish & Richardson P.C.

(57) ABSTRACT

A semiconductor package includes a first interconnection structure, a first semiconductor chip disposed on the first interconnection structure and including a plurality of through-vias and first pads connected to the plurality of through-vias; a second semiconductor chip disposed on the first interconnection structure, including second pads electrically connected to the first pads, and having a size different from a size of the first semiconductor chip; a heat dissipation structure contacting and surrounding side surfaces of at least one of the first semiconductor chip and the second semiconductor chip, and including a material having higher thermal conductivity than a thermal conductivity of silicon; and an encapsulant surrounding side surfaces of the heat dissipating structure.

20 Claims, 26 Drawing Sheets

(51) Int. Cl.
*H01L 23/48* (2006.01)
*H01L 23/538* (2006.01)
*H01L 25/065* (2023.01)
*H01L 23/00* (2006.01)

(52) U.S. Cl.
CPC ............... *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2225/06568* (2013.01)

(56) References Cited

U.S. PATENT DOCUMENTS

| | | |
|---|---|---|
| 2014/0225235 A1 | 8/2014 | Du |
| 2015/0129190 A1 | 5/2015 | Lin |
| 2015/0155218 A1 | 6/2015 | Hung et al. |
| 2018/0269126 A1 | 9/2018 | Im et al. |
| 2019/0164863 A1* | 5/2019 | Cho ..................... H01L 24/32 |
| 2020/0328189 A1 | 10/2020 | Sung |
| 2020/0335480 A1 | 10/2020 | Hwang et al. |
| 2021/0118767 A1 | 4/2021 | Chi et al. |
| 2021/0118770 A1 | 4/2021 | Kuo et al. |

\* cited by examiner

I-I'

II–II'

SEMICONDUCTOR PACKAGE HAVING IMPROVED HEAT DISSIPATION CHARACTERISTICS

CROSS-REFERENCE TO RELATED APPLICATION(S)

A claim of priority under 35 USC 119 is made to Korean Patent Application No. 10-2021-0189829 filed on Dec. 28, 2021 in the Korean Intellectual Property Office, the entirety of which is hereby incorporated by reference.

BACKGROUND

The present disclosure relates to semiconductor packages, and more particularly semiconductor packages having improved heat dissipation characteristics.

As miniaturization and the degree of integration of semiconductor chips have increased, heat dissipation systems capable of effectively externally dissipating heat generated by semiconductor chips of semiconductor packages are required.

SUMMARY

Embodiments of the inventive concepts provide a semiconductor package that includes a first interconnection structure including a first insulating layer and first interconnection layers; a first semiconductor chip on the first interconnection structure; a second semiconductor chip disposed on the first semiconductor chip and having a width smaller than a width of the first semiconductor chip; a heat dissipation structure surrounding side surfaces of the second semiconductor chip, the heat dissipation structure on an upper surface of the first semiconductor chip and including a material having higher thermal conductivity than a thermal conductivity of silicon; an encapsulant surrounding the first semiconductor chip and the heat dissipation structure, the encapsulant on the first interconnection structure; and a second interconnection structure disposed on the encapsulant and the second semiconductor chip, and including a second insulating layer and second interconnection layers.

Embodiments of the inventive concepts further provide a semiconductor package that includes a first interconnection structure; a first semiconductor chip on the first interconnection structure; a second semiconductor chip disposed on the first semiconductor chip and having a width smaller than a width of the first semiconductor chip; a first heat dissipation pattern surrounding side surfaces of the second semiconductor chip, the first heat dissipation pattern on an upper surface of the first semiconductor chip and including a material having higher thermal conductivity than a thermal conductivity of silicon; a second heat dissipation pattern surrounding side surfaces of the first semiconductor chip and side surfaces of the first heat dissipation pattern, the second heat dissipation pattern on the first interconnection structure and including a material having higher thermal conductivity than the thermal conductivity of silicon; and an encapsulant surrounding side surfaces of the second heat dissipation pattern, the encapsulant on the first interconnection structure.

Embodiments of the inventive concepts still further provide a semiconductor package that includes a first interconnection structure; a first semiconductor chip disposed on the first interconnection structure and including a plurality of through-vias and first pads connected to the plurality of through-vias; a second semiconductor chip disposed on the first interconnection structure and including second pads electrically connected to the first pads, the second semiconductor chip having a size different than a size of the first semiconductor chip; a heat dissipation structure contacting and surrounding side surfaces of at least one of the first semiconductor chip and the second semiconductor chip, and including a material having higher thermal conductivity than a thermal conductivity of silicon; and an encapsulant surrounding side surfaces of the heat dissipating structure.

Embodiments of the inventive concepts also provide a semiconductor package that include a first interconnection structure; a first semiconductor chip on the first interconnection structure; a second semiconductor chip on the first semiconductor chip; an encapsulant surrounding side surfaces of the first semiconductor chip and side surfaces of the second semiconductor chips; and a first heat dissipation pattern on an upper surface of the first semiconductor chip between the side surfaces of the second semiconductor chip and the encapsulant. The first heat dissipation pattern including a material having higher thermal conductivity than a thermal conductivity of silicon.

BRIEF DESCRIPTION OF DRAWINGS

The above and other aspects, features, and advantages of the inventive concepts will be more clearly understood from the following detailed description, taken in conjunction with the accompanying drawings, in which.

DETAILED DESCRIPTION

Figure 1A:
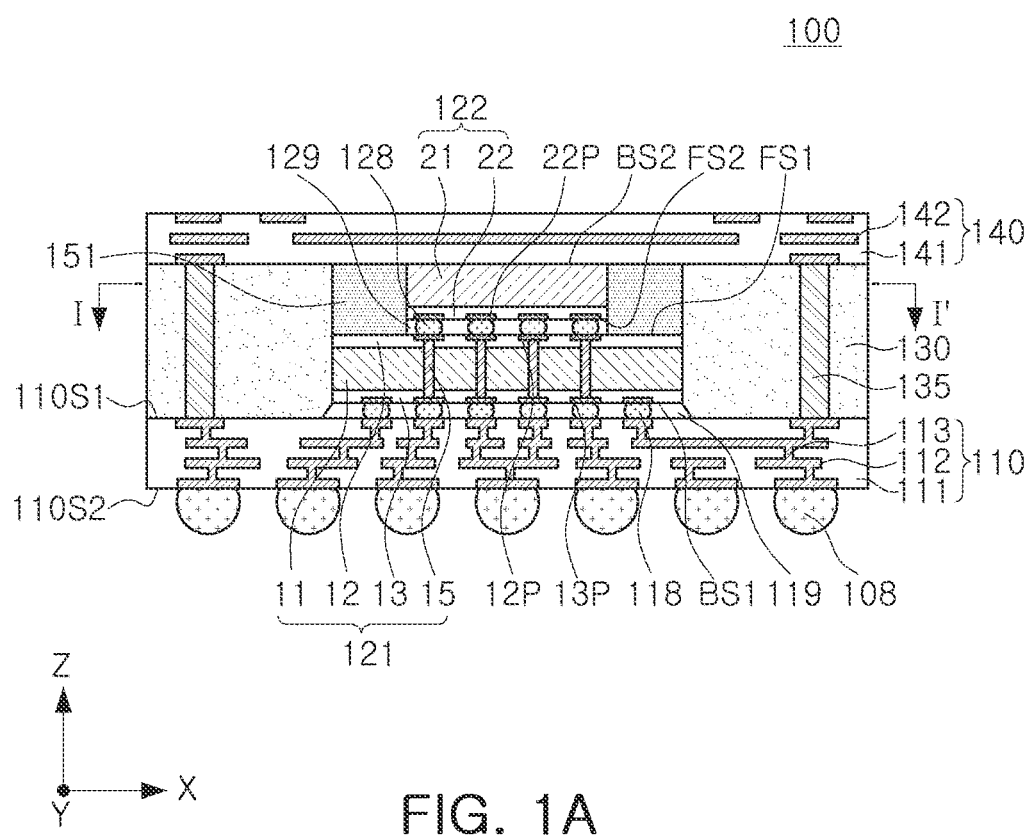
FIG. 1A illustrates a schematic cross-sectional view of a semiconductor package according to embodiments of the inventive concepts.

Hereinafter, embodiments of the inventive concepts will be described in detail with reference to the accompanying drawings. Herein, like reference numerals will denote like elements throughout the figures, and redundant descriptions thereof may be omitted for conciseness. Throughout the description, relative locations of components may be described using terms such as "vertical", "horizontal", "over", "higher" and so on. These terms are for descriptive purposes only, and are intended only to describe the relative locations of components assuming the orientation of the overall device is the same as that shown in the drawings. The embodiments, however, are not limited to the illustrated device orientations.

Figure 1B:
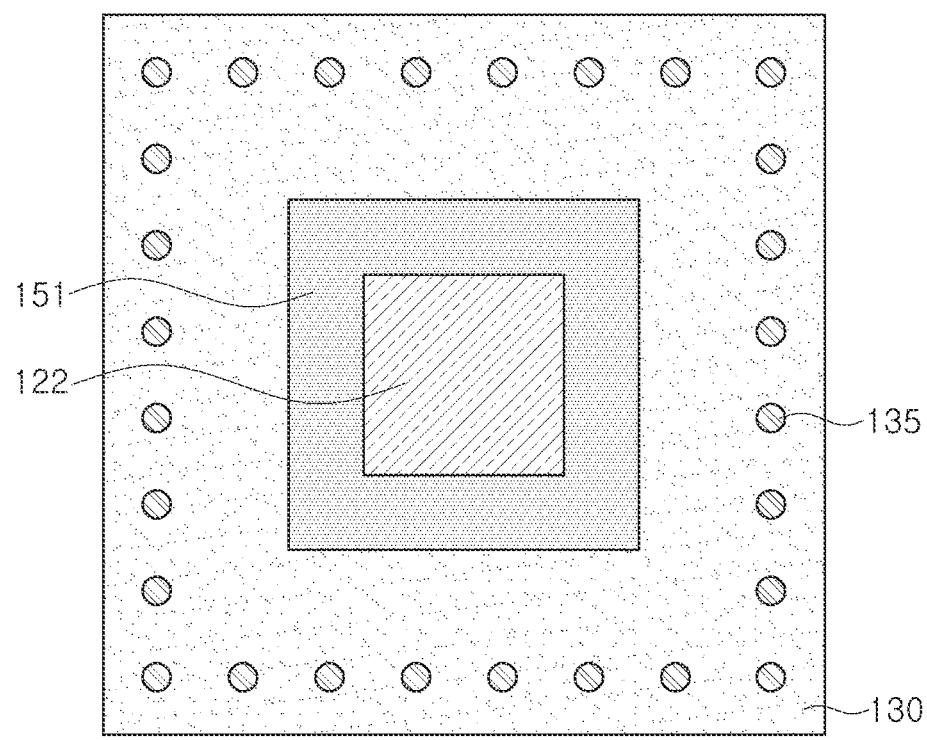
FIG. 1B illustrates a schematic horizontal top plan view of the semiconductor package of FIG. 1A taken along line I-I' according to embodiments of the inventive concepts.

FIG. 1A illustrates a schematic cross-sectional view of a semiconductor package according to embodiments of the inventive concept. FIG. 1B illustrates a schematic horizontal top plan view a semiconductor package of FIG. 1A taken along line I-I'.

Referring to FIGS. 1A and 1B, a semiconductor package 100 according to an example embodiment may include a first interconnection structure 110, a first semiconductor chip 121 on the first interconnection structure 110, a second semiconductor chip 122 on the first semiconductor chip 121, an encapsulant 130 covering the first semiconductor chip 121, a second interconnection structure 140 on the encapsulant 130, and a first heat dissipation pattern 151 on the upper surface of the first semiconductor chip 121 and surrounding the side surfaces of the second semiconductor chip 122. The first heat dissipation pattern 151 may be a heat spreader and may serve to radiate heat generated by the first and second semiconductor chips 121 and 122 externally. The first heat dissipation pattern 151 may directly contact the first and second semiconductor chips 121 and 122, without a heat transfer material layer interposed therebetween in relation to the first and second semiconductor chips 121 and 122. The first heat dissipation pattern 151 may be referred to as a 'heat dissipation structure'.

The first interconnection structure 110 may be a substrate for a semiconductor package, for example, including a printed circuit board (PCB), a ceramic substrate, a glass substrate, a tape interconnection board, or the like. The first interconnection structure 110 may include, for example, an interposer or a redistribution structure including redistribution layers. The first interconnection structure 110 may include a first insulating layer 111, first interconnection layers 112, and first vias 113.

The first insulating layer 111 may include for example silicon oxide, silicon nitride, silicon oxynitride, or tetraethylorthosilicate (TEOS). The first insulating layer 111 may include a photoimageable resin such as photoimageable dielectric (PID) or photosensitive polyimide (PSPI). The first insulating layer 111 may include for example FR-4, glass, ceramic, epoxy resin, phenol resin, urethane resin, silicone resin, polyimide resin, or the like. The first insulating layer 111 may include a plurality of layers.

The first interconnection layers 112 and the first vias 113 may include a metal material such as, for example, copper (Cu), aluminum (Al), silver (Ag), tin (Sn), gold (Au), nickel (Ni), lead (Pb) or titanium (Ti), a nitride of the metal material, or an alloy of the metal materials. The first vias 113 may electrically connect the first interconnection layers 112 disposed on different levels to each other. The first interconnection layers 112 and the first vias 113 may be formed as a multilayer structure in the first interconnection structure 110, and the number of stacked layers thereof is not limited to the illustration and may vary according to example embodiments. First connection bumps 108 may be electrically connected to second interconnection layers 142 through the first interconnection layers 112, the first vias 113, and vertical connection structure 135.

The semiconductor package 100 may further include first connection bumps 108 disposed below a lower surface 110S2 of the first interconnection structure 110 and may be electrically connected to the first interconnection layers 112. The first connection bumps 108 may be electrically connected to first back pads 13P of the first semiconductor chip 121 through the first interconnection layers 112 and the first vias 113.

The first connection bumps 108 may include a low-melting-point metal, for example, or an alloy (e.g., Sn—Ag—Cu) including tin (Sn). The first connection bumps 108 may include, for example, tin (Sn), indium (In), bismuth (Bi), antimony (Sb), copper (Cu), silver (Ag), zinc (Zn), lead (Pb) and/or alloys thereof. The alloy may include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, or the like. The first connection bumps 108 may include, for example, solder balls. Each of the first connection bumps 108 may have a land, ball, or pin shape. Each of the first connection bumps 108 may be formed as a multilayer structure or a monolayer structure. The first connection bumps 108 may physically and/or electrically connect the semiconductor package 100 to an external source or a circuit board for example.

The first semiconductor chip 121 may be disposed on the upper surface 110S1 of the first interconnection structure 110. The first semiconductor chip 121 may include a first semiconductor layer 11, a first front layer 12, a first back layer 13, first front pads 12P, the first back pads 13P, and first through-vias 15. The first semiconductor chip 121 may be disposed in such a manner that the first back layer 13 faces the first interconnection structure 110.

The first semiconductor layer 11 may be a cut portion of a semiconductor wafer including a semiconductor element such as silicon or germanium, or a compound semiconductor such as silicon carbide (SiC), gallium arsenide (GaAs), indium arsenide (InAs), or indium phosphide (InP). The first semiconductor layer 11 may have an active surface (e.g., a surface facing the first front layer 12) having an active region doped with impurities, and an inactive surface opposite to the active surface. In other embodiments, the first semiconductor layer 11 may have an active surface facing the upper surface 110S1 of the first interconnection structure 110, and an inactive surface opposite to the active surface.

The first front layer 12 may be disposed on the upper surface of the first semiconductor layer 11, and may include an insulating layer and an interconnection structure. The insulating layer may include flowable oxide (FOX), tonen silazen (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), high density plasma (HDP) oxide, plasma enhanced oxide (PEOX), flowable CVD (FCVD) oxide, or combinations thereof. The insulating layer may be a single layer or may include a plurality of insulating layers. The interconnection structure may be formed in a multilayer structure including interconnection patterns and vias formed of, for example, aluminum (Al), gold (Au), cobalt (Co), copper (Cu), nickel (Ni), lead (Pb), tantalum (Ta), tellurium (Te), titanium (Ti), tungsten (W), or combinations thereof. A barrier layer (not illustrated) including titanium (Ti), titanium nitride (TiN), tantalum (Ta), or tantalum nitride (TaN) may be disposed between the interconnection pattern and/or the via and the insulating layer.

The first front layer 12 may form an active layer, and elements constituting an integrated circuit on the upper surface of the first semiconductor layer 11 may be formed in the first front layer 12. The elements may include for example an FET such as a planar FET (field effect transistor) or finFET, a memory element such as flash memory, dynamic random access memory (DRAM), static random access memory (SRAM), electrically erasable programmable read-only memory (EEPROM), phase-change random access memory (PRAM), magnetic random access memory (MRAM), ferroelectric random access memory (FeRAM), resistive random access memory (RRAM), and the like, logic elements such as AND, OR, and NOT elements and the like, and various active and/or passive elements such as system large scale integration (LSI), CMOS imaging sensors (CIS), micro-electro-mechanical systems (MEMS).

The first front pads 12P may be disposed on a first front surface FS1 of the first semiconductor chip 121 facing a second front surface FS2 of the second semiconductor chip 122, and may be connection terminals electrically connected to the elements of the first front layer 12 and the interconnection structure therein. The first front pads 12P may be electrically connected to through vias 15, respectively. The first front pads 12P may include any one of, for example, copper (Cu), nickel (Ni), titanium (Ti), aluminum (Al), gold (Au), and silver (Ag), or alloys thereof.

The first back layer 13 may be disposed on the lower surface of the first semiconductor layer 11 to provide a first back surface BS1 of the first semiconductor chip 121. The first back layer 13 may include an insulating layer and an interconnection structure, which has the same or similar characteristics to the interconnection structure and the insulating layer of the first front layer 12 described above, and thus redundant descriptions will be omitted.

The first back pads 13P may be disposed on the first back surface BS1 facing the upper surface 110S1 of the first interconnection structure 110, and may be electrically connected to the first interconnection layers 112 of the first interconnection structure 110. The first back pads 13P may be electrically connected to the through vias 15, respectively. The first back pads 13P may include any one of copper (Cu), nickel (Ni), titanium (Ti), aluminum (Al), gold (Au), and silver (Ag), or alloys thereof.

The first through via 15 may be a through silicon via (TSV), and may penetrate the first semiconductor layer 11 in a vertical direction (Z-axis direction) and provide an electrical path connecting the first front pads 12P and the second front pads 13P to each other. The first through via 15 may include an insulating spacer layer and a conductive layer. The conductive layer may include a conductive plug and a barrier layer surrounding the conductive plug. The conductive plug of the first through-via 15 may include, for example, tungsten (W), titanium (Ti), aluminum (Al), or copper (Cu).

The second semiconductor chip 122 may be disposed on the first front surface FS1 that is the upper surface of the first semiconductor chip 121. The second semiconductor chip 122 includes the second front surface FS2 and a second back surface BS2. The second semiconductor chip 122 may have a width smaller than a width of the first semiconductor chip 121. The second semiconductor chip 122 may include a second semiconductor layer 21, a second front layer 22, and second front pads 22P. The second semiconductor chip 122 may be disposed such that the second front layer 22 faces the first semiconductor chip 121.

The second semiconductor layer 21 may be a cut portion of a semiconductor wafer including a semiconductor element such as silicon or germanium, or a compound semiconductor such as silicon carbide (SiC), gallium arsenide (GaAs), indium arsenide (InAs), and indium phosphide (InP). The second semiconductor layer 21 may have an active surface (e.g., a surface facing the second front layer 22) having an active region doped with impurities, and an inactive surface opposite thereto.

The second front layer 22 may be disposed below the lower surface of the second semiconductor layer 21, and may include an insulating layer and an interconnection structure. The insulating layer may include flowable oxide (FOX), tonen silazen (TOSZ), undoped silica glass (USG), borosilica glass (BSG), phosphosilica glass (PSG), borophosphosilica glass (BPSG), plasma enhanced tetra ethyl ortho silica (PETEOS), fluoride silicate glass (FSG), high density plasma (HDP) oxide, plasma enhanced oxide (PEOX), flowable CVD (FCVD) oxide, or combinations thereof. The insulating layer of the second front layer 22 may be a single layer or may include a plurality of insulating layers. The interconnection structure of the second front layer 22 may be formed in a multilayer structure including interconnection patterns and vias formed of, for example, aluminum (Al), gold (Au), cobalt (Co), copper (Cu), nickel (Ni), lead (Pb), tantalum (Ta), tellurium (Te), titanium (Ti), tungsten (W) or combinations thereof. Between the interconnection pattern and/or the via and the insulating layer, a barrier film (not illustrated) including titanium (Ti), titanium nitride (TiN), tantalum (Ta), or tantalum nitride (TaN) may be disposed.

In the second front layer 22, elements constituting an integrated circuit may be disposed on the lower surface of the second semiconductor layer 21. The elements may be comprised of memory devices that store or output data based on an address command and a control command received from the first semiconductor chip 121. As an example, the memory elements may include volatile memory devices such as DRAM and SRAM, or non-volatile memory devices such as PRAM, MRAM, FeRAM or RRAM.

The second front pads 22P may be disposed on the second front surface FS2 of the second semiconductor chip 122 facing the first front surface FS1 of the first semiconductor chip 121, and may be connection terminals electrically connected to the elements of the second front layer 22 and the interconnection structure therein. The second front pads 22P may include any one of, for example, copper (Cu), nickel (Ni), titanium (Ti), aluminum (Al), gold (Au), silver (Ag), or alloys thereof.

The semiconductor package 100 may further include second connection bumps 118 electrically connecting the first back pads 13P of the first semiconductor chip 121 to the first interconnection layers 112 of the first interconnection structure 110, and third connection bumps 128 electrically connecting the first front pads 12P of the first semiconductor chip 121 and the second front pads 22P of the second semiconductor chip 122 to each other. The semiconductor package 100 may further include a first adhesive layer 119 surrounding at least a portion of the second connection bumps 118, and a second adhesive layer 129 surrounding at least a portion of the third connection bumps 128.

The second connection bumps 118 and the third connection bumps 128 may have a smaller size than the first connection bumps 108. The first semiconductor chip 121 may be mounted on the first interconnection structure 110 by the second connection bumps 118 by a flip-chip bonding method. In other embodiments, the first semiconductor chip 121 may be directly connected to the first interconnection structure 110 without the second connection bumps 118, or the second semiconductor chip 122 may be directly connected to the first semiconductor chip 121 without the third connection bumps 128. In this case, the first and second adhesive layers 119 and 129 may be omitted.

The encapsulant 130 may be disposed on the first interconnection structure 110 and may cover the first semiconductor chip 121. The encapsulant 130 may seal or surround at least a portion of side surfaces of the first semiconductor chip 121. The encapsulant 130 may contact side surfaces of the first heat dissipation pattern 151. The encapsulant 130 may include an insulating material, for example, a thermosetting resin such as an epoxy resin, a thermoplastic resin such as polyimide, or Ajinomoto Build-up Film® (ABF), FR-4, bismaleimide triazine (BT), epoxy molding compound (EMC), or prepreg containing an inorganic filler and/or a glass fiber.

The semiconductor package 100 may further include a vertical connection structure 135 disposed in a hole of the encapsulant 130. The vertical connection structure 135 may be disposed to be spaced apart from the side surface of the first semiconductor chip 121, and may be a structure for electrically connecting the first interconnection structure 110 and the second interconnection structure 140 to each other. The hole of the encapsulant 130 may be formed by performing a laser drilling process or an etching process. In other embodiments, the semiconductor package 100 may further include a frame having a through-hole in which the first semiconductor chip 121 is mounted, instead of the vertical connection structure 135. The frame may include a plurality of insulating layers, a plurality of via patterns, and a plurality of metal patterns. As shown in FIG. 1B, a plurality of vertical connection structures 135 may be disposed surrounding the first and second semiconductor chips 121 and 122 along the X and Y directions.

The second interconnection structure 140 may be disposed on and in contact with the second back surface BS2 that is the upper semiconductor chip 122. The second interconnection structure 140 may be, for example, a substrate for a semiconductor package, including a printed circuit board (PCB), a ceramic substrate, a glass substrate, a tape interconnection board, and the like. The second interconnection structure 140 may include an interposer. The second interconnection structure 140 may include a second insulating layer 141, the second interconnection layers 142, and second vias (not illustrated). The second vias may be disposed between the second interconnection layers 142 disposed on different levels to electrically connect the second interconnection layers 142 to each other.

The second insulating layer 141 may include for example silicon oxide, silicon nitride, silicon oxynitride, or tetraethylorthosilicate (TEOS). The second insulating layer 141 may include a photosensitive resin such as photoimageable dielectric (PID) or photosensitive polyimide (PSPI). The second insulating layer 141 may include FR-4, glass, ceramic, epoxy resin, phenol resin, urethane resin, silicone resin, polyimide resin, or the like. The second insulating layer 141 may be a single layer or may include a plurality of layers.

The second interconnection layers 142 may include a metal material such as, for example, copper (Cu), aluminum (Al), silver (Ag), tin (Sn), gold (Au), nickel (Ni), lead (Pb), or titanium (Ti), a nitride of the metal material, or an alloy of the metal materials. The second interconnection layers 142 may be formed in a multilayer structure in the second interconnection structure 140, and the number of stacked layers is not limited to the illustrated amount thereof and may vary according to example embodiments. For example, the second interconnection layers 142 may include a ground (GrouND: GND) pattern, a power (PoWeR: PWR) pattern, and a signal (S) pattern. The signal (S) pattern may include various signals other than a ground (GND) pattern and a power (PWR) pattern, for example, a data signal.

The first heat dissipation pattern 151 may be in contact with the first front surface FS1 that is the upper surface of the first semiconductor chip 121, and side surfaces of the second semiconductor chip 122. The second interconnection structure 140 may be disposed on and in contact with the first heat dissipation pattern 151. The first heat dissipation pattern 151 may contact the second adhesive layer 129. The first heat dissipation pattern 151 may include a material having higher thermal conductivity than silicon (Si). The first heat dissipation pattern 151 may include, for example, at least one of copper (Cu), nickel (Ni), aluminum (Al), silver (Ag), and gold (Au). The first heat dissipation pattern 151 does not include particles or powder of a conductive material in the resin, but may include a single metallic material or a plurality of metallic materials of copper (Cu), nickel (Ni), aluminum (Al), silver (Ag), and gold (Au). The first heat dissipation pattern 151 may not include a resin. The first heat dissipation pattern 151 may include, for example, graphene. When the first heat dissipation pattern 151 is formed of Cu, the first heat dissipation pattern 151 may include a barrier layer formed of Al and a conductive layer formed of Cu. In this case, the barrier layer may serve to prevent diffusion of Cu elements of the conductive layer into the first and second semiconductor chips 121 and 122. The barrier layer is not limited to Al material and may include other materials. Since the material constituting the first heat dissipation pattern 151 is harder than the material constituting the encapsulant 130, the first heat dissipation pattern 151 may prevent and alleviate warpage of the semiconductor package 100.

In the case in which one semiconductor chip is divided into the first semiconductor chip 121 and the second semiconductor chip 122 stacked up and down or vertically on each other on the first interconnection structure 110, the planar area occupied by the semiconductor chip may be reduced. However, when the thickness of the respective chips 121 and 122 is reduced in order to reduce the total thickness of the stacked chips 121 and 122, heat generation may increase due to an increase in arrangement density of components inside the semiconductor chip. According to example embodiments, to improve the heat dissipation characteristics of the semiconductor package without increasing the area and thickness of the semiconductor package, the first heat dissipation pattern 151 having higher thermal conductivity than silicon may be disposed to surround side surfaces of the second semiconductor chip 122 as shown in FIG. 1B. Heat generated from the first and second semiconductor chips 121 and 122 may be radiated through the first heat dissipation pattern 151 over a larger area externally, without increasing the thickness, and therefore heat dissipation characteristics of the semiconductor package may be improved.

FIGS. 2 to 5 respectively illustrate schematic cross-sectional views of semiconductor packages according to embodiments of the inventive concepts.

Figure 2:
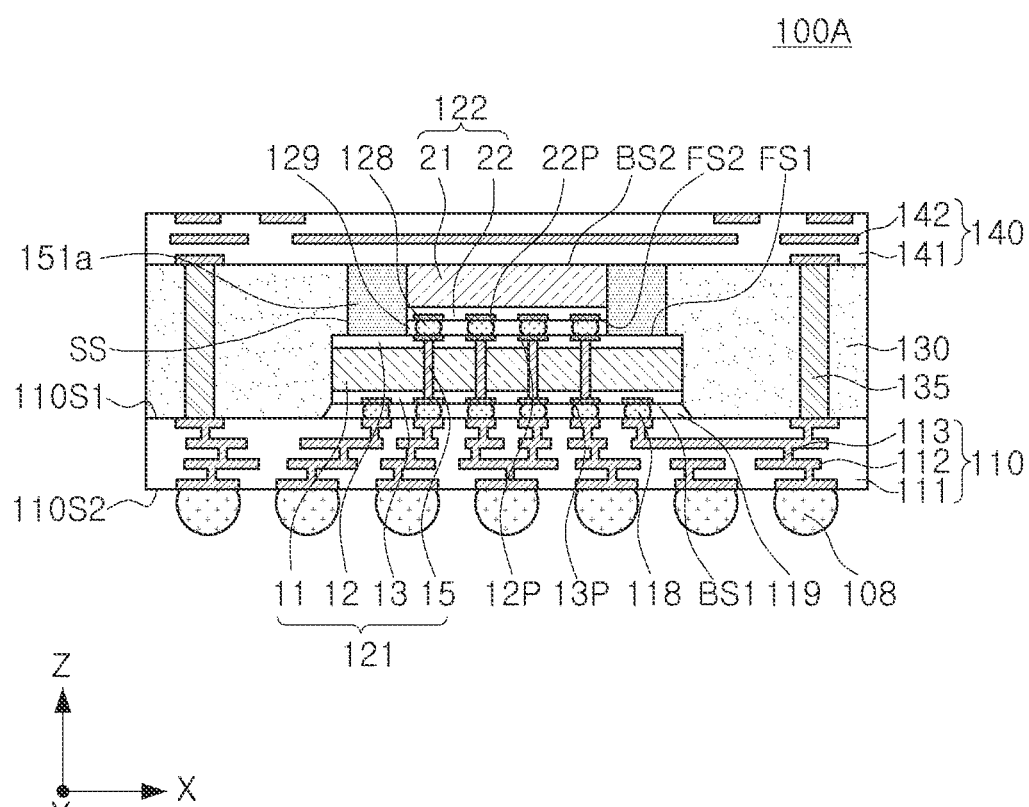
FIG. 2 illustrates a schematic cross-sectional view of a semiconductor package according to embodiments of the inventive concepts.

Referring to FIG. 2, an outer side surface SS of a first heat dissipation pattern 151a of a semiconductor package 100A may overlap a first semiconductor chip 121 in the vertical direction (Z). The edge of the upper surface of the first semiconductor chip 121 may be partially exposed without being covered by the first heat dissipation pattern 151a. For example, the outer side surface of the first semiconductor chip 121 and the outer side surface of the first heat dissipation pattern 151a may not be coplanar with each other. Before cutting the first semiconductor chip 121 along the scribe lane, a groove may be first formed in the first heat dissipation pattern 151a, to thus manufacture the semiconductor package 1000A in FIG. 2.

Figure 3:
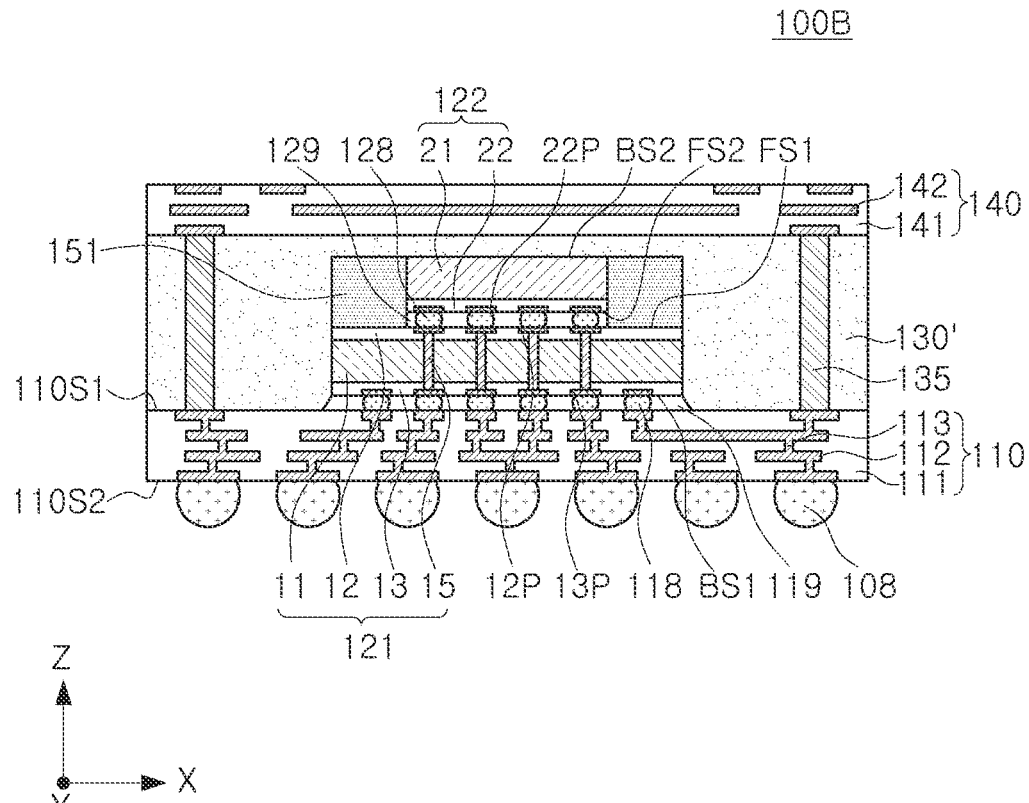
FIG. 3 illustrates a schematic cross-sectional view of a semiconductor package according to embodiments of the inventive concepts.

Referring to FIG. 3, an encapsulant 130' of a semiconductor package 100B may cover the upper surface of the first heat dissipation pattern 151 and the upper surface (e.g., the back surface BS2) of the second semiconductor chip 122. The second interconnection structure 140 may be spaced apart from the first heat dissipation pattern 151 and the second semiconductor chip 122.

Figure 4:
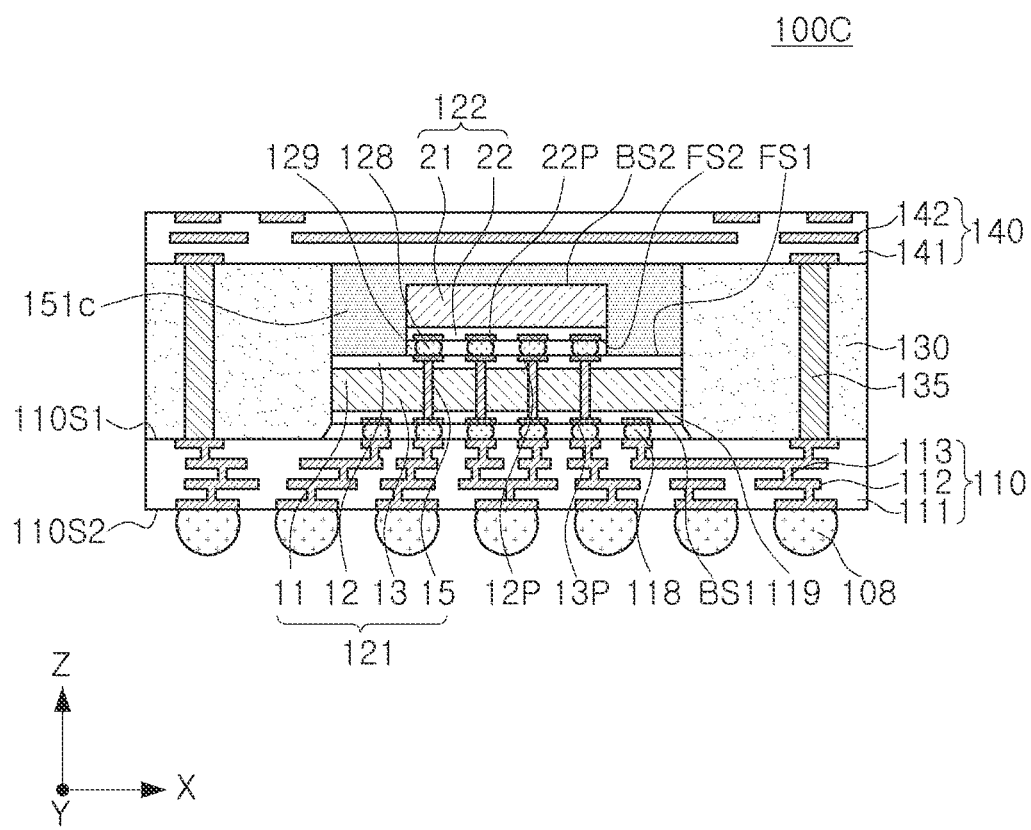
FIG. 4 illustrates a schematic cross-sectional view of a semiconductor package according to embodiments of the inventive concepts.

Referring to FIG. 4, a first heat dissipation pattern 151c of a semiconductor package 100C may cover the upper surface (e.g., the back surface BS2) of the second semiconductor chip 122. Since the first heat dissipation pattern 151c is disposed to surround side surfaces and an upper surface of the second semiconductor chip 122, heat dissipation characteristics may be further improved.

Figure 5:
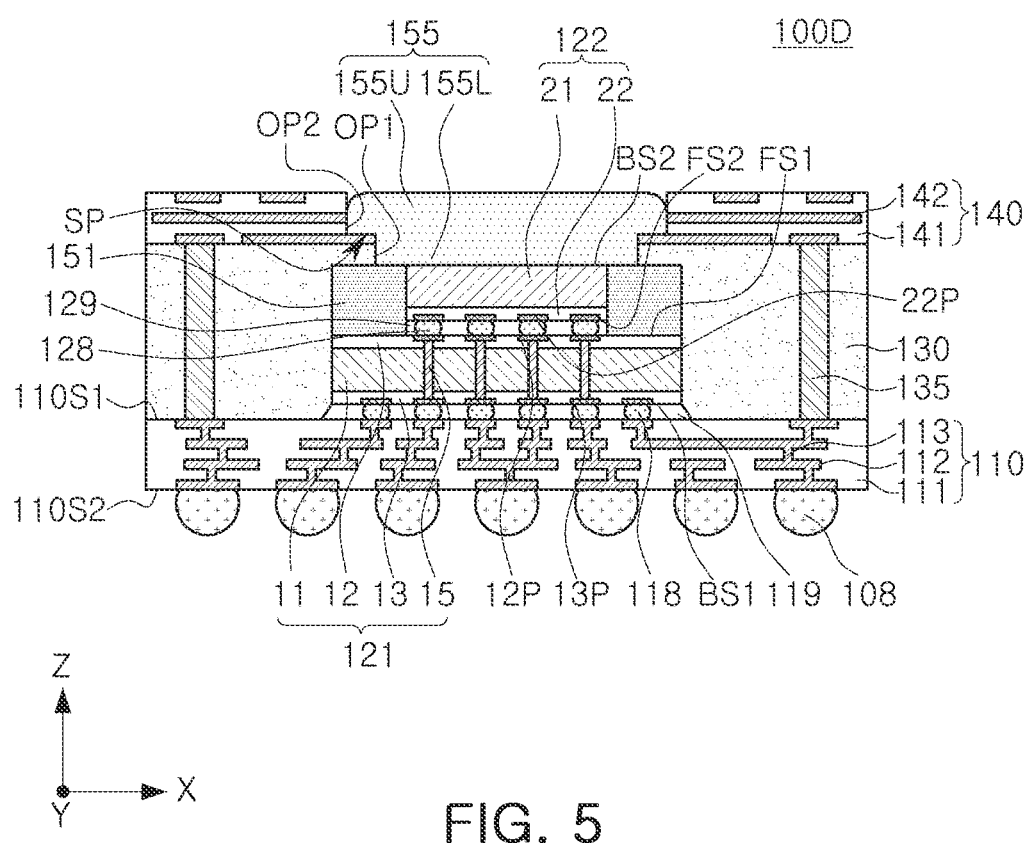
FIG. 5 illustrates a schematic cross-sectional view of a semiconductor package according to embodiments of the inventive concepts.

Referring to FIG. 5, a semiconductor package 100D may further include an upper heat dissipation pattern 155. The upper heat dissipation pattern 155 may be disposed in a first opening OP1 of the encapsulant 130 and a second opening OP2 of the second interconnection structure 140, and may be in contact with the first heat dissipation pattern 151 and the second semiconductor chip 122. The second opening OP2 has a step portion SP, such that at least one of the second interconnection layers 142, e.g., a portion of the upper surface of a lowermost second interconnection layer 142 may be exposed. The upper heat dissipation pattern 155 may have a rivet shape, and includes, for example, a lower portion 155L having a first width and an upper portion 155U having a second width greater than the first width. The upper portion 155U may be disposed on the lower portion 155L. The upper heat dissipation pattern 155 may include the same material as the first heat dissipation pattern 151. By the upper heat dissipation pattern 155, warpage of the semiconductor package 100D may be prevented and relieved, stress concentration in the interface between the second interconnection structure 140 and the upper heat dissipation pattern 155 may be relieved, and bonding strength may be improved. In addition to the upper heat dissipation pattern 155, the lowermost second interconnection layer 142 in contact with the upper heat dissipation pattern 155 also serves as a heat spreader, and therefore, heat may be radiated over a relatively larger area, improving heat dissipation efficiency. The first heat dissipation pattern 151 and the upper heat dissipation pattern 155 may be referred to as a 'heat dissipation structure.'

According to some example embodiments, the upper heat dissipation pattern 155 may partially recess and contact the lowermost second interconnection layer 142, may include a plurality of step portions that sequentially expose the second interconnection layers 142, or may include the lower portion 155L having a width greater than the width of the second semiconductor chip 122.

Figure 6A:
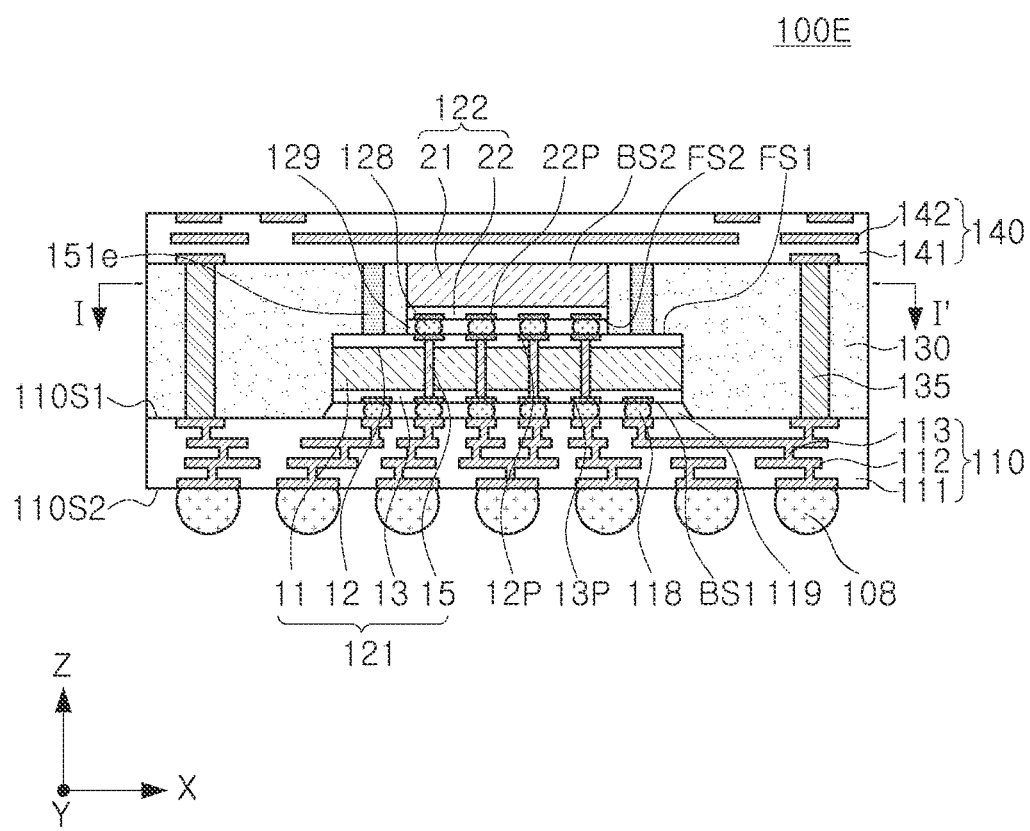
FIG. 6A illustrates a schematic cross-sectional view of a semiconductor package according to embodiments of the inventive concepts.
Figure 6B:
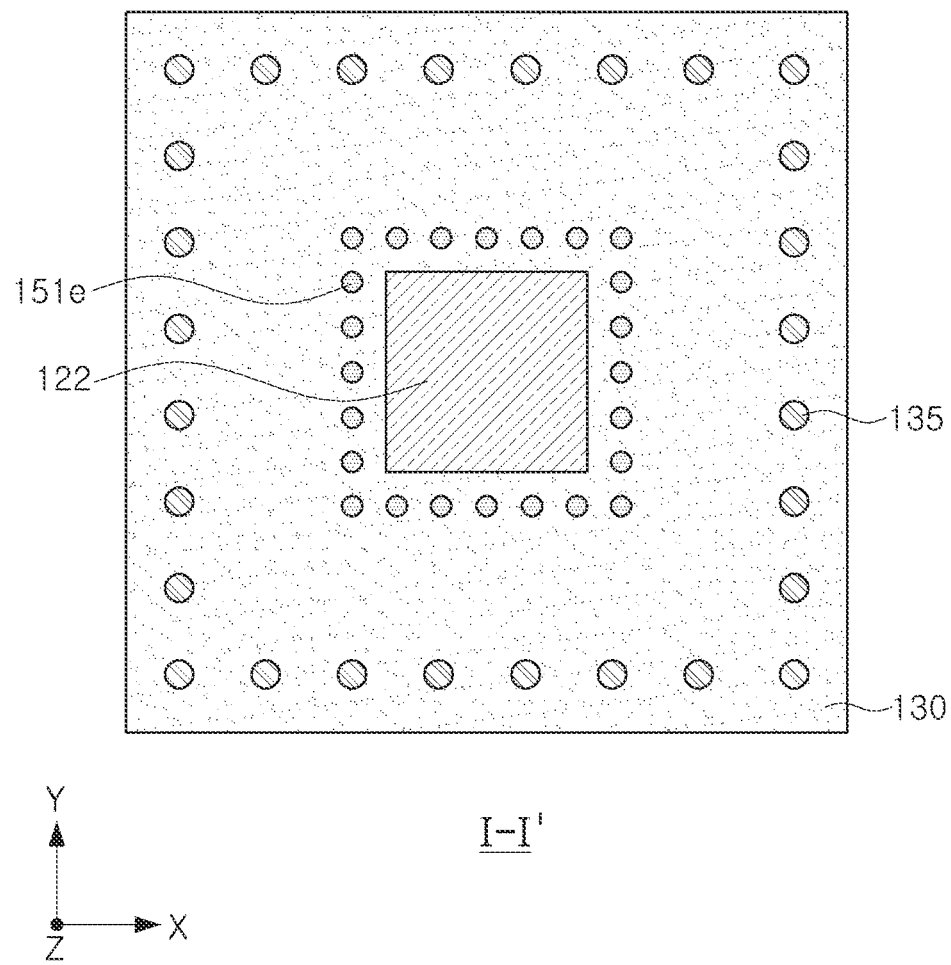
FIG. 6B illustrates a schematic horizontal top plan view of the semiconductor package of FIG. 6A taken along line I-I' according to embodiments of the inventive concepts.

FIG. 6A illustrates a schematic cross-sectional view of a semiconductor package according to embodiments of the inventive concepts. FIG. 6B illustrates a schematic horizontal top plan view of a semiconductor package of FIG. 6A taken along line I-I'.

Referring to FIGS. 6A and 6B, a first heat dissipation pattern 151e of a semiconductor package 100E may include a plurality of patterns spaced apart from each other. As illustrated in FIG. 6B, the plurality of patterns may be disposed to surround the second semiconductor chip 122 along the X and Y directions. The plurality of patterns may be disposed in via-type holes passing through the encapsulant 130 and may be characterized as heat dissipation columns separated from each other.

Figure 7:
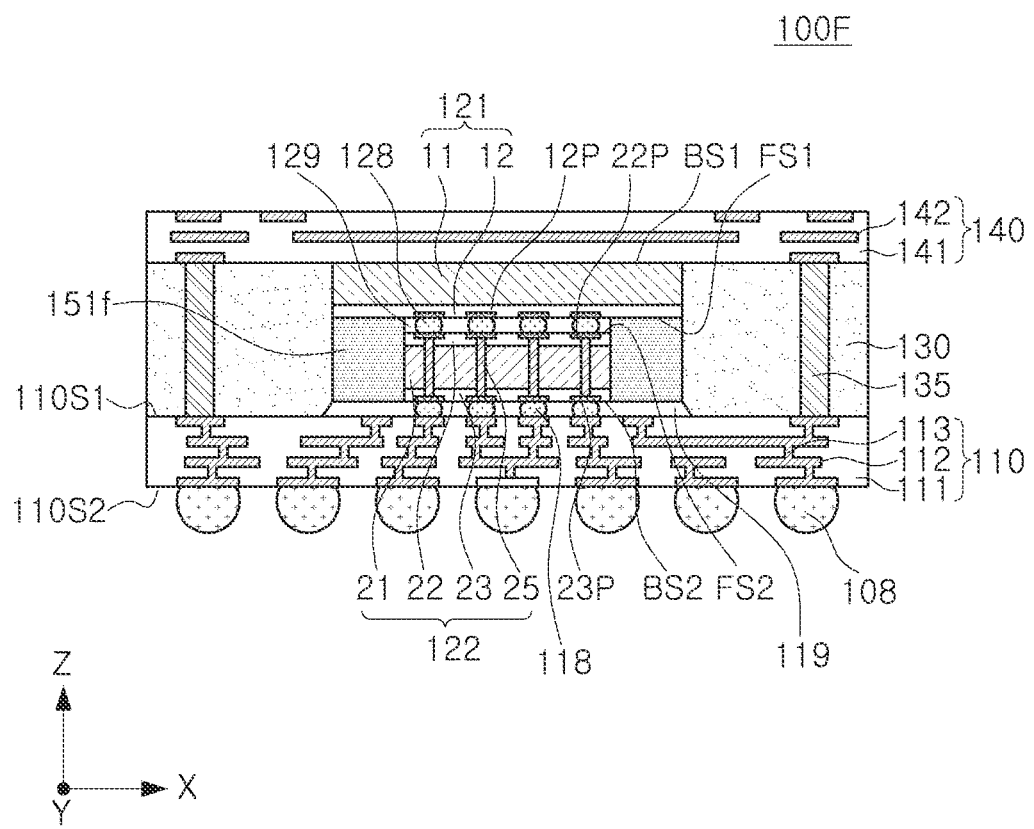
FIG. 7 illustrates a schematic cross-sectional view of a semiconductor package according to embodiments of the inventive concepts.

FIG. 7 illustrates a schematic cross-sectional view of a semiconductor package according to embodiments of the inventive concepts.

Referring to FIG. 7, in a semiconductor package 100F, the first semiconductor chip 121 may be disposed on the second semiconductor chip 122 with respect to the first interconnection structure 110. A width of the second semiconductor chip 122 may be smaller than a width of the first semiconductor chip 121. The chip stack structure of the first semiconductor chip 121 and the second semiconductor chip 122 may be formed by stacking and dicing semiconductor chips by a chip-on-wafer method and then mounting the semiconductor chips in an inverted state on the first interconnection structure 110. For example, the second semiconductor chip 122 may be fixed on a semiconductor wafer (refer to '121W' in FIG. 16) including the first semiconductor chip 121, and the first semiconductor chip 121 may be formed by dicing the semiconductor wafer turned upside down on the first interconnection structure 110. For example, the chip stack structure may be mounted on the first interconnection structure 110 such that the second semiconductor chip 122 faces the upper surface 110S1 of the first interconnection structure 110.

The first semiconductor chip 121 may include a first semiconductor layer 11 and a first front layer 12, and unlike the previous embodiments, may not include the first back layer 13 and the first through-vias 15. The second semiconductor chip 122 may include a second semiconductor layer 21, a second front layer 22, a second back layer 23, and second through-vias 25. The second through via 25 may be a through silicon via (TSV), and penetrate the second semiconductor layer 21 in the vertical direction (Z), thereby providing an electrical path to connect the second front layer 22 and the second back layer 23 to each other.

A first heat dissipation pattern 151f may surround side surfaces of the second semiconductor chip 122, below the first front surface FS1 that is the lower surface of the first semiconductor chip 121. The first heat dissipation pattern 151*f* may contact side surfaces of the second semiconductor chip 122 and may contact the first adhesive layer 119.

Figure 8A:
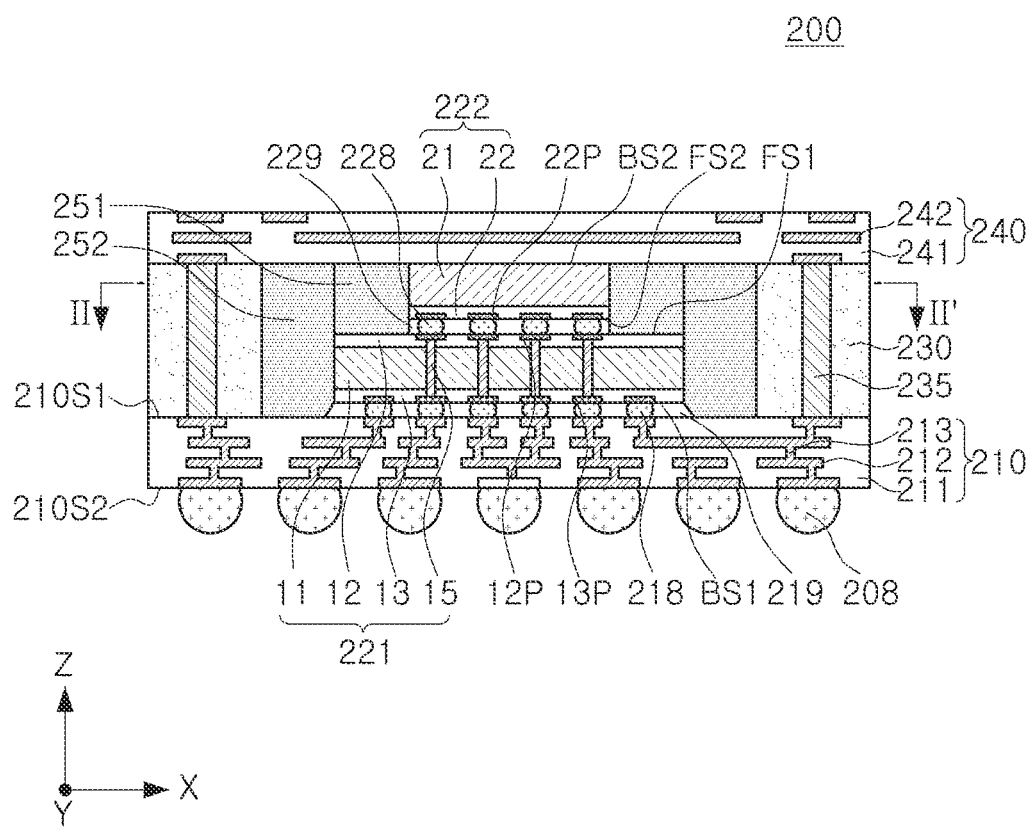
FIG. 8A illustrates a schematic cross-sectional view of a semiconductor package according to embodiments of the inventive concepts.
Figure 8B:
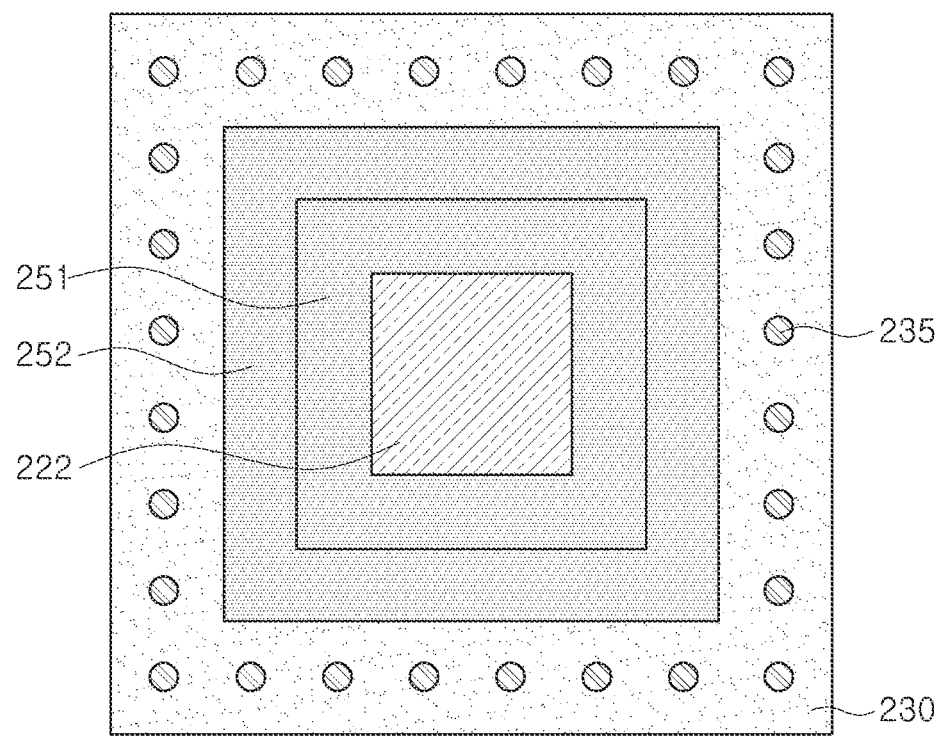
FIG. 8B illustrates a schematic horizontal top plan view of the semiconductor package of FIG. 8A taken along line II-II' according to embodiments of the inventive concepts.

FIG. 8A illustrates a schematic cross-sectional view of a semiconductor package according to embodiments of the inventive concepts. FIG. 8B illustrates a schematic horizontal top plan view of the semiconductor package of FIG. 8A taken along line II-II'.

Referring to FIGS. 8A and 8B, a semiconductor package 200 according to an example embodiment includes similar components as those of the semiconductor package 100 of FIGS. 1A and 1B, but may further include a second heat dissipation pattern 252 surrounding the side surfaces of a first semiconductor chip 221 and side surfaces of a first heat dissipation pattern 251, and on a first interconnection structure 210. Components corresponding to those of the semiconductor package 100 of FIGS. 1A and 1B are denoted by similar reference numerals, and redundant descriptions may be omitted from the following for brevity. For example, description of components in FIGS. 8A and 8B including reference numerals 208, 210, 210S2, 211, 212, 213, 218, 219, 228, 229, 230, 235, 240, 241 and 242 respectively corresponding to components in FIGS. 1A and 1B having similar reference numerals is omitted. The first heat dissipation pattern 251 and the second heat dissipation pattern 252 may be referred to as a 'heat dissipation structure'.

The second heat dissipation pattern 252 may contact an upper surface 210S1 of the first interconnection structure 210 and side surfaces of the first semiconductor chip 221. The second heat dissipation pattern 252 may contact the first adhesive layer 219. The second heat dissipation pattern 252 may have a thickness greater than that of the first heat dissipation pattern 251 in the vertical direction Z. A lower surface of the second heat dissipation pattern 252 may be positioned at a lower level than a lower surface of the first semiconductor chip 221. A width of the second heat dissipation pattern 252 may be greater than a width of the first semiconductor chip 221. The width of the second heat dissipation pattern 252 may indicate a horizontal distance between outer side surfaces of the second heat dissipation pattern 252 contacting the encapsulant 230. The second heat dissipation pattern 252 may include the same material as the first heat dissipation pattern 251. However, since the first heat dissipation pattern 251 and the second heat dissipation pattern 252 are not formed at the same time, but are respectively formed in different process operations, the interface therebetween may be distinguished according to the process conditions of the material layer constituting the heat dissipation patterns 251 and 252.

Like the first heat dissipation pattern 251, the second heat dissipation pattern 252 may improve heat dissipation characteristics of the semiconductor package without increasing the area and thickness of the semiconductor package. For example, since the second heat dissipation pattern 252 is in contact with the first heat dissipation pattern 251 and the first semiconductor chips 221, heat generated by the first and second semiconductor chips 221 and 222 may be emitted externally through relatively wider area, thereby improving heat dissipation characteristics of the semiconductor package.

FIGS. 9 to 13 respectively illustrate schematic cross-sectional views of semiconductor packages according to embodiments of the inventive concepts.

Figure 9:
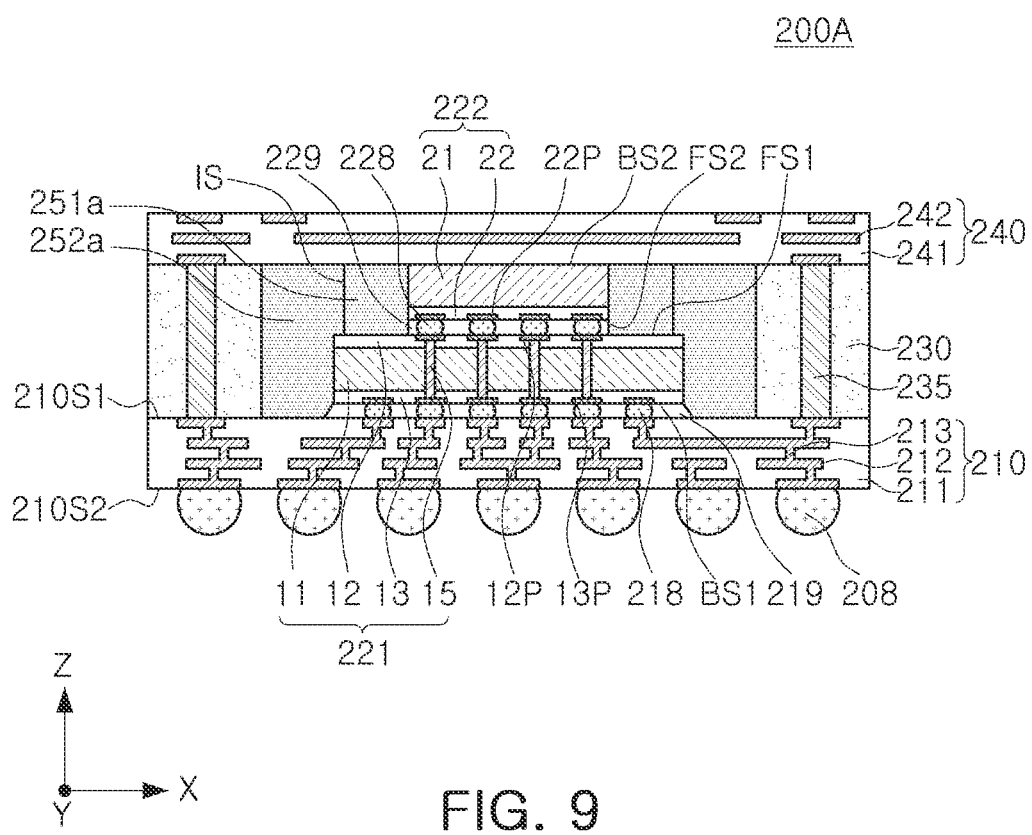
FIG. 9 illustrates a schematic cross-sectional view of a semiconductor package according to embodiments of the inventive concepts.

Referring to FIG. 9, the outer side surface of the first heat dissipation pattern 251*a* of the semiconductor package 200A, for example, an interface IS between the first heat dissipation pattern 251*a* and the second heat dissipation pattern 252*a*, may overlap the first semiconductor chip 221 in the vertical direction (Z). The edge of the upper surface of the first semiconductor chip 221 may not be covered by the first heat dissipation pattern 251*a*, but may be covered by the second heat dissipation pattern 252*a*.

Figure 10:
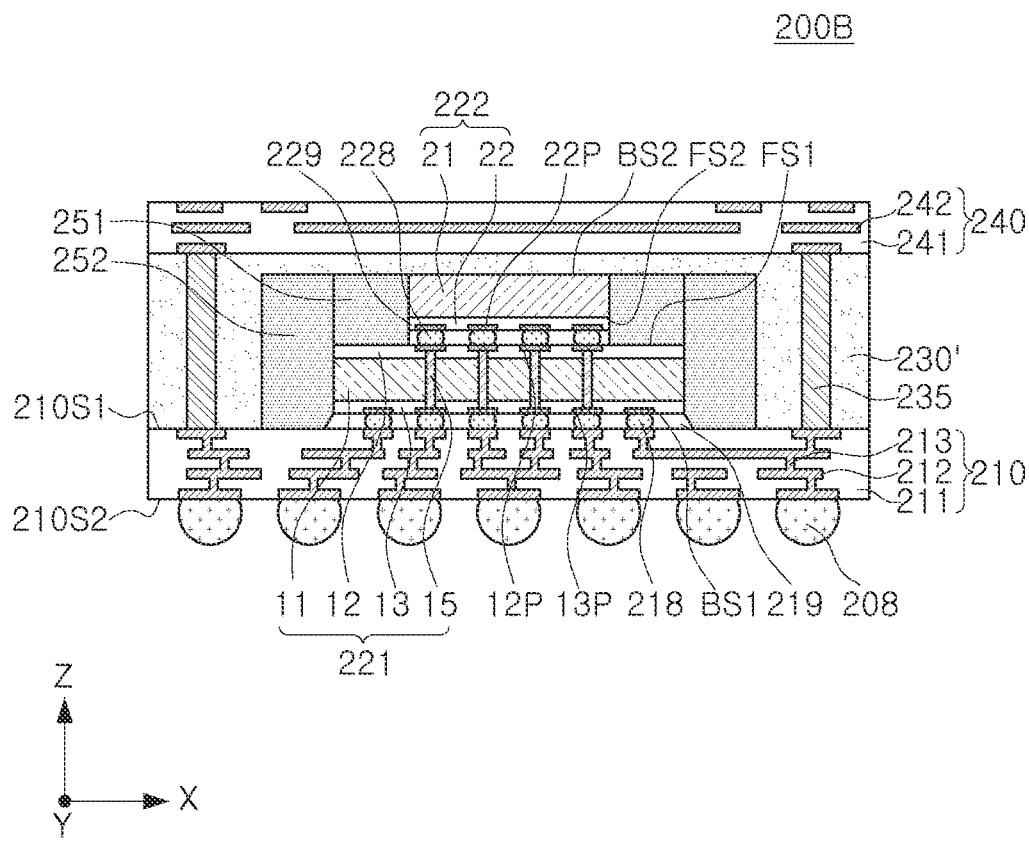
FIG. 10 illustrates a schematic cross-sectional view of a semiconductor package according to embodiments of the inventive concepts.

Referring to FIG. 10, an encapsulant 230' of a semiconductor package 200B may cover the upper surface of the first heat dissipation pattern 251, the upper surface of the second heat dissipation pattern 252, and the upper surface (e.g., the back surface BS2) of the second semiconductor chip 222. The second interconnection structure 240 may be spaced apart from the first heat dissipation pattern 251, the second heat dissipation pattern 252, and the second semiconductor chip 222.

Figure 11:
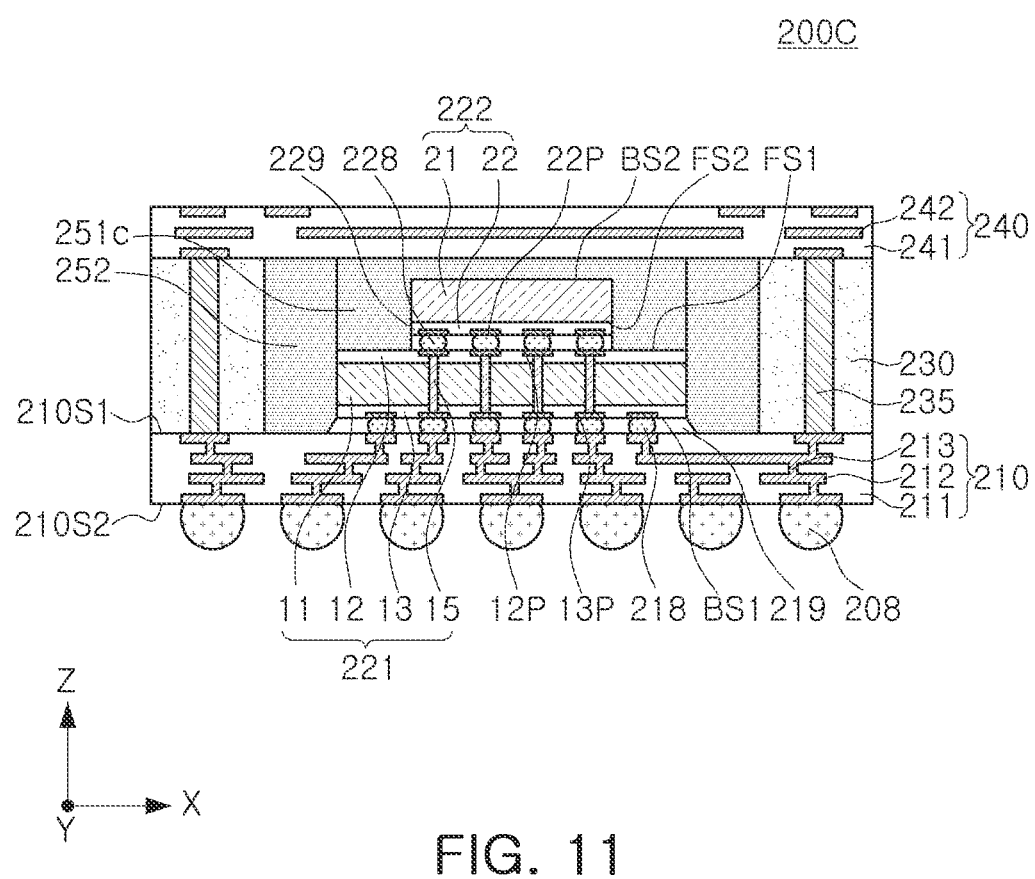
FIG. 11 illustrates a schematic cross-sectional view of a semiconductor package according to embodiments of the inventive concepts.

Referring to FIG. 11, a first heat dissipation pattern 251*c* of a semiconductor package 200C may cover the upper surface of the second semiconductor chip 222 (e.g., the back surface BS2). Since the first heat dissipation pattern 251*c* is disposed to surround side surfaces and an upper surface of the second semiconductor chip 222, heat dissipation characteristics may be further improved.

Figure 12:
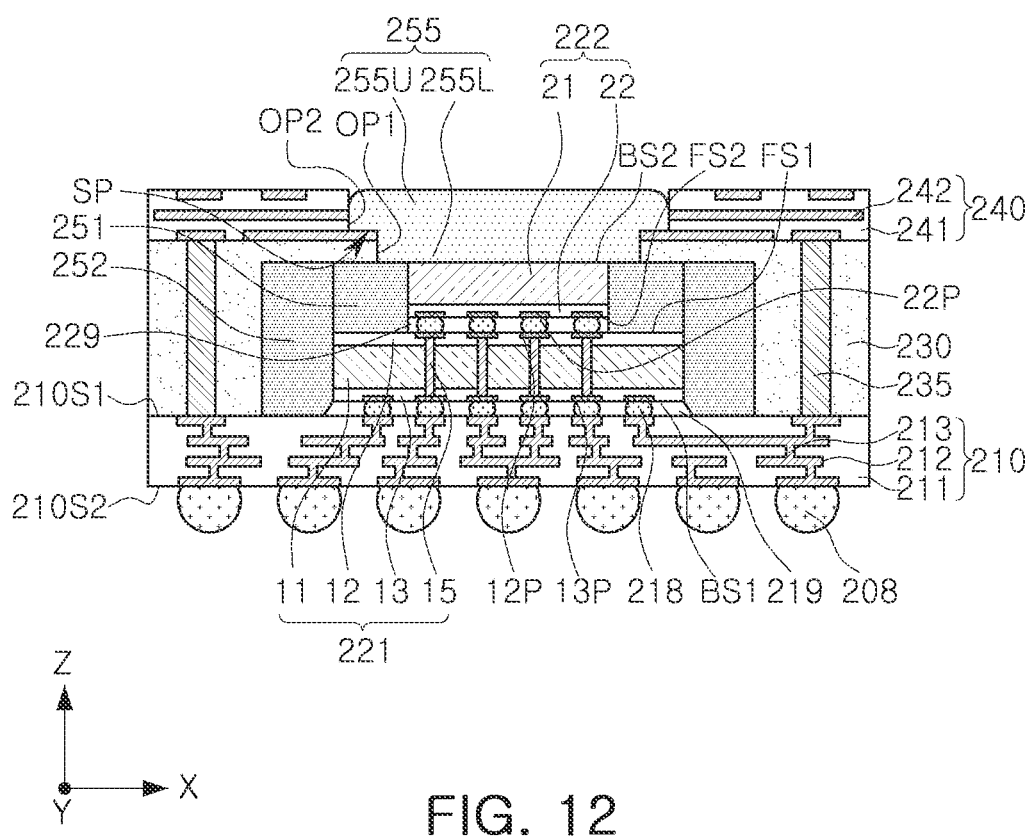
FIG. 12 illustrates a schematic cross-sectional view of a semiconductor package according to embodiments of the inventive concepts.

Referring to FIG. 12, a semiconductor package 200D may further include an upper heat dissipation pattern 255. The upper heat dissipation pattern 255 has a rivet shape and may contact a lowermost second interconnection layer 242 in the second opening OP2 providing the step portion SP. The description of the upper heat dissipation pattern 255 overlaps with the description of the upper heat dissipation pattern 155 of FIG. 5 and redundant descriptions is omitted.

Figure 13:
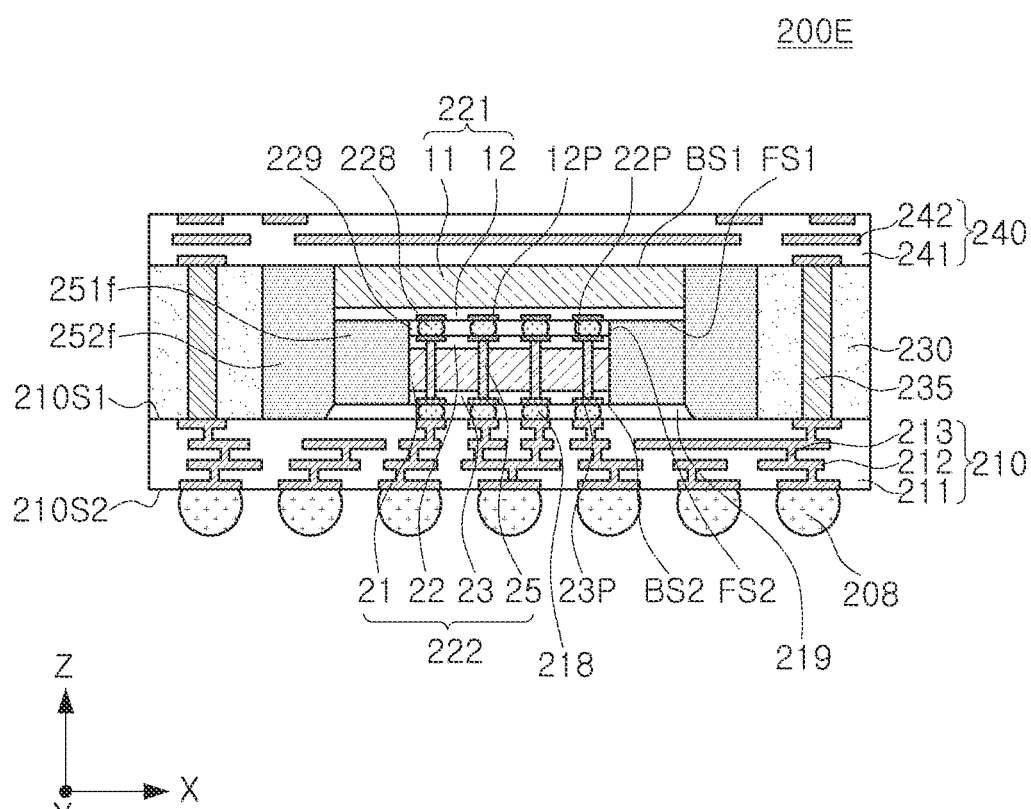
FIG. 13 illustrates a schematic cross-sectional view of a semiconductor package according to embodiments of the inventive concepts.

Referring to FIG. 13, in a semiconductor package 200E, the first semiconductor chip 221 may be disposed on the second semiconductor chip 222 with respect to the first interconnection structure 210. A width of the second semiconductor chip 222 may be less than a width of the first semiconductor chip 221. In the example embodiment of FIG. 13, similar to the example embodiment of FIG. 7, after stacking and dicing semiconductor chips using a chip-on-wafer method, the same in an inverted state may be mounted on the first interconnection structure 210, thereby forming a chip stack structure.

A first heat dissipation pattern 251*f* may surround side surfaces of the second semiconductor chip 222, below the first front surface FS1 that is the lower surface of the first semiconductor chip 221. The first heat dissipation pattern 251*f* may contact side surfaces of the second semiconductor chip 222 and may contact the first adhesive layer 219. The second heat dissipation pattern 252*f* may contact and surround side surfaces of the first heat dissipation pattern 251*f*, and may contact side surfaces of the first semiconductor chip 221.

Figure 14:
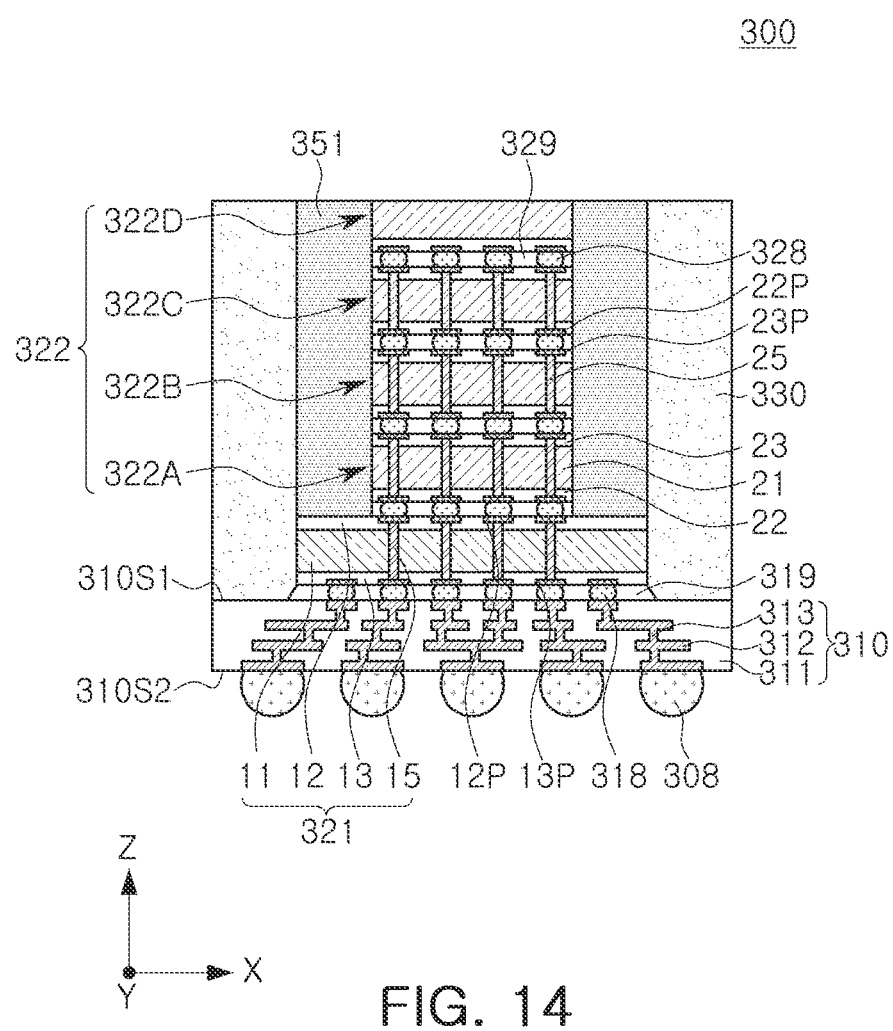
FIG. 14 illustrates a schematic cross-sectional view of a semiconductor package according to embodiments of the inventive concepts.
Figure 15:
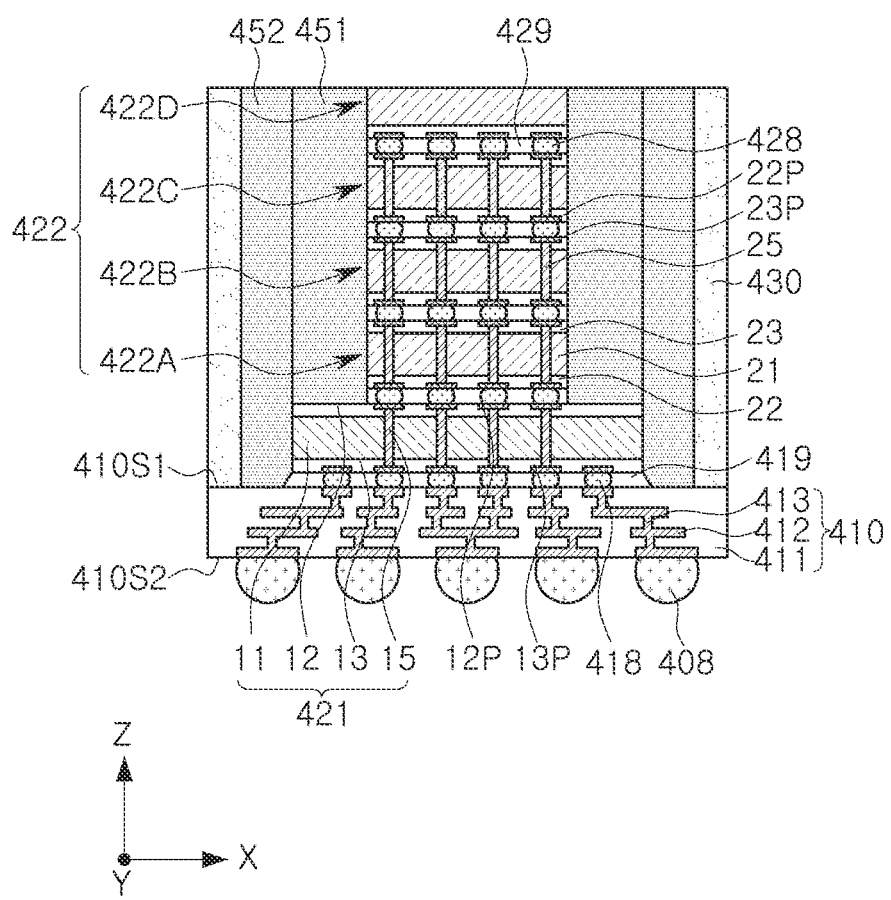
FIG. 15 illustrates a schematic cross-sectional view of a semiconductor package according to embodiments of the inventive concepts.

FIGS. 14 and 15 respectively illustrate schematic cross-sectional views of semiconductor packages according to embodiments of the inventive concepts. Components corresponding to those of the semiconductor package 100 in FIGS. 1A and 1B are denoted by similar reference numerals, and redundant description thereof may be omitted from the following. For example, description of components in FIG. 13 including reference numerals 308, 310, 310S1, 310S2, 311, 312, 313, 318 and 319 respectively corresponding to components in FIGS. 1A and 1B having similar reference numerals is omitted from the following.

Referring to FIG. 14, a semiconductor package 300 may have the same or similar characteristics as those described with reference to FIGS. 1A and 1B, except for including a chip structure 322 that is disposed on a first semiconductor chip 321 and that includes a plurality of second semiconductor chips 322A, 322B, 322C and 322D. The first heat dissipation pattern 351 may surround side surfaces of each of the plurality of second semiconductor chips 322A, 322B, 322C, and 322D. In the case of the first heat dissipation pattern 351, since heat generated from the first semiconductor chip 321 and the plurality of second semiconductor chips 322A, 322B, 322C and 322D may be radiated externally over a relatively larger area through the first heat dissipation pattern 351, without increasing the thickness of the semiconductor package 300, heat dissipation characteristic of the semiconductor package may be improved. The encapsulant 330 may expose the upper surface of an uppermost second semiconductor chip 322D among the plurality of second semiconductor chips 322A, 322B, 322C and 322D, but in some embodiments, may cover the upper surface of the uppermost second semiconductor chip 322D. The number of the plurality of second semiconductor chips 322A, 322B, 322C, and 322D is not limited to that illustrated in the drawings, and may be two, three, or five or more.

Except for the uppermost second semiconductor chip 322D among the plurality of second semiconductor chips 322A, 322B, 322C, and 322D, the remaining second semiconductor chips may be electrically connected to each other through second through-vias 25. Since the second through-vias 25 have similar characteristics to the through-vias 15 of FIGS. 1A and 1B, redundant description will be omitted. Front and back pads 22P and 23P, connection bumps 328, and adhesive layers 329 may be disposed between the plurality of second semiconductor chips 322A, 322B, 322C, and 322D. However, in some embodiments, the connection bumps 328 and the adhesive layers 329 may be omitted, and the plurality of second semiconductor chips 322A, 322B, 322C, and 322D may be directly bonded to each other without connection bumps.

For example, the first semiconductor chip 321 may be a logic chip including a CPU, GPU, FPGA, application processor (AP), digital signal processor (DSP), cryptographic processor, microprocessor, microcontroller, analog-to-digital converter, application-specific integrated circuit (ASIC), and the like, and the plurality of second semiconductor chips 322A, 322B, 322C, and 322D may be memory chips such as DRAM, SRAM, PRAM, MRAM, FeRAM, or RRAM. For example, the first semiconductor chip 321 may be a buffer chip including a plurality of logic devices and/or memory devices. Accordingly, the first semiconductor chip 321 may transmit signals from the plurality of second semiconductor chips 322A, 322B, 322C, and 322D stacked thereon externally, and may also transmit signals and power from an external source to the plurality of second semiconductor chips 322A, 322B, 322C, and 322D. The first semiconductor chip 321 may perform both a logic function and a memory function through logic elements and memory elements. However, according to an example embodiment, the first semiconductor chip 321 may only perform the logic function by including only the logic elements. The plurality of second semiconductor chips 322A, 322B, 322C, and 322D may include, for example, volatile memory chips such as DRAM and SRAM, or non-volatile memory chips such as PRAM, MRAM, FeRAM, or RRAM. For example, the semiconductor package 300 of the present embodiment may be used in a high bandwidth memory (HBM) product, an electro data processing (EDP) product, or the like.

Referring to FIG. 15, a semiconductor package 400 may have the same or similar characteristics as those described with reference to FIG. 14, except that a second heat dissipation pattern 452 is further included. The second heat dissipation pattern 452 may contact an upper surface 410S1 of a first interconnection structure 410 and side surfaces of a first semiconductor chip 421. Like the first heat dissipation pattern 451, the second heat dissipation pattern 452 may improve heat dissipation characteristics of the semiconductor package without increasing the area and thickness of the semiconductor package. Description of components in FIG. 15 having similar reference numerals as respective components in FIG. 14 including reference numerals 408, 410S2, 411, 412, 413, 418, 419, 422, 422A, 422B, 422C, 422D, 428, 429 and 430 have been omitted for brevity.

FIGS. 16 to 21 illustrate sequential views of a process of manufacturing a semiconductor package according to embodiments of the inventive concepts.

Figure 16:
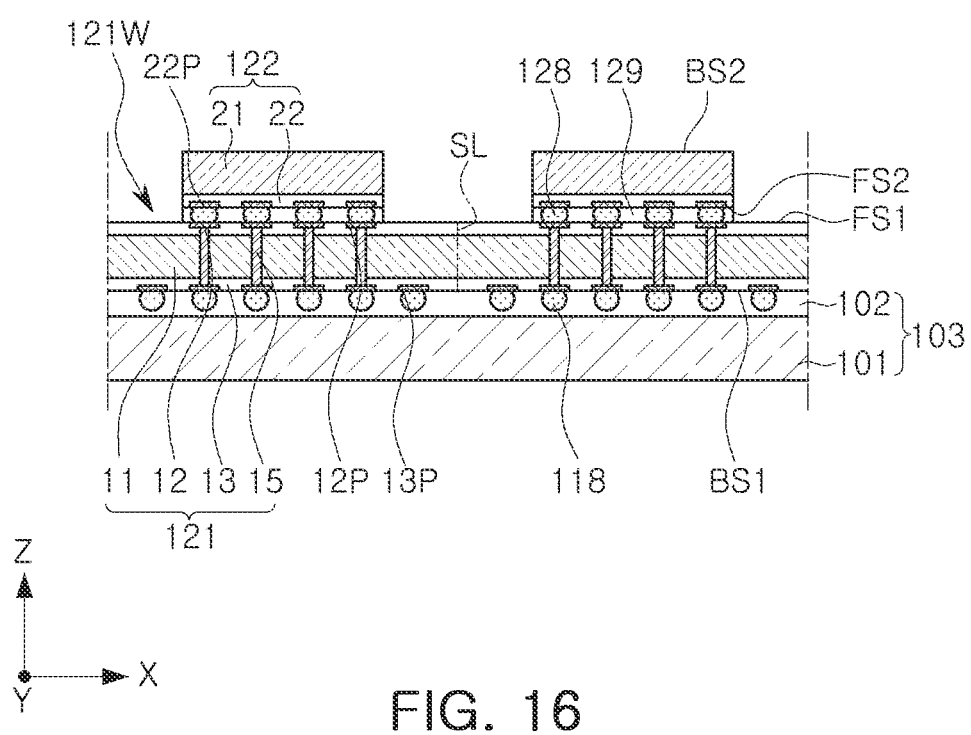
FIGS. 16, 17A, 17B, 18A, 18B, 19, 20 and 21 illustrate sequential views of a process of manufacturing a semiconductor package according to embodiments of the inventive concepts.

Referring to FIG. 16, a semiconductor wafer 121W for first semiconductor chips 121 including a first semiconductor layer 11, a first front layer 12, a first back layer 13, and through vias 15 may be attached onto a carrier 103, and second semiconductor chips 122 may be attached onto the semiconductor wafer 121W.

The semiconductor wafer 121W may be in a state in which components for the first semiconductor chips 121 are implemented. The first semiconductor chips 121 may be discriminated by scribe lanes SL in the semiconductor wafer 121W.

The carrier 103 may include a carrier substrate 101 and an adhesive material layer 102. The semiconductor wafer 121W may be attached on the carrier 103 such that the first back surface BS1, which is the lower surface of the first semiconductor chip 121 on which the second connection bumps 118 are disposed, faces the adhesive material layer 102. The second connection bumps 118 may be covered by the adhesive material layer 102, and the lower surface of the semiconductor wafer 121W may contact the upper surface of the adhesive material layer 102.

In a state in which the adhesive film layer is formed on the front surface FS2, the second semiconductor chip 122 may be vacuum-adsorbed on the adsorption surface of the bonding device and picked and placed on the semiconductor wafer 121W. The adhesive film layer may be in a state of surrounding the third connection bumps 128 attached below the second semiconductor chip 122. The second semiconductor chip 122 may be fixed on the semiconductor wafer 121W by performing a thermal compression process, and the second adhesive layer 129 surrounding the third connection bumps 128 may be formed between the first semiconductor chip 121 and the second semiconductor chip 122. The thermal compression process may be performed by adjusting process conditions (e.g., pressure during thermocompression bonding, the amount of non-conductive material constituting the adhesive film, or the like), and the adhesive layer 129 may be formed to include a fillet extending outwardly further than the outer side surface of the second semiconductor chip 122.

Figure 17A:
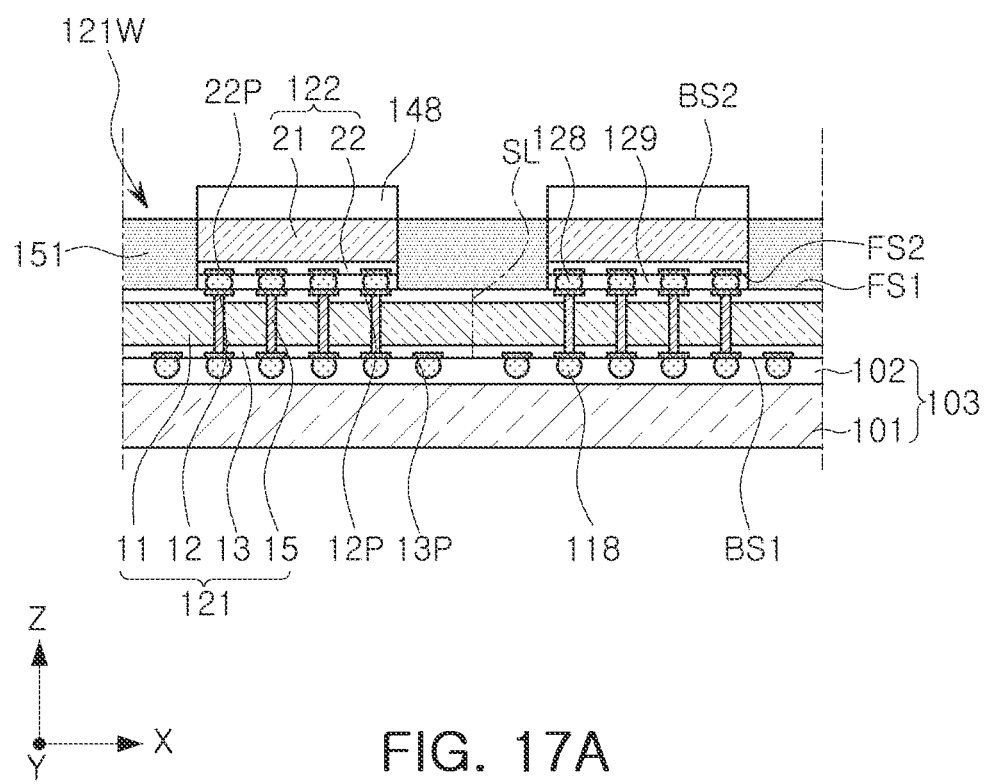
Figure 17B:
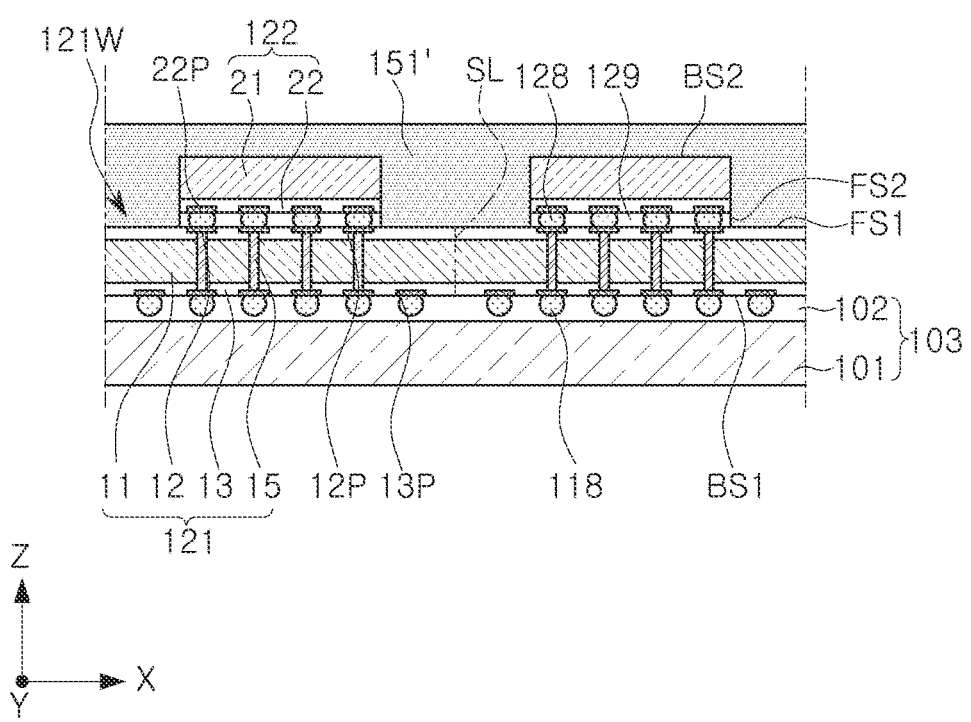

Referring to FIGS. 17A and 17B, first heat dissipation patterns 151 and 151' may be formed on the semiconductor wafer 121W. FIG. 17A illustrates a process of forming a first heat dissipation pattern 151 covering side surfaces of the second semiconductor chip 122 by forming a mask 148, and FIG. 17B illustrates a process of forming the first heat dissipation pattern 151' covering the side surfaces and the upper surface of the second semiconductor chip 122 without forming the mask 158.

Referring to FIG. 17A, a mask 148 covering the second semiconductor chip(s) 122 and exposing the first semiconductor chip(s) 121 may be formed, and the first heat dissipation pattern 151 may be formed on the first front surface FS1 that is an exposed upper surface of the first semiconductor chip 121 and on side surfaces of the second semiconductor chip 122, and the mask 148 may be removed. The first heat dissipation pattern 151 may be formed by, for example, a cold spray method. The cold spray method may be a method of attaching the metal powder onto the substrate by discharging the metal powder together with a high-speed gas through a nozzle. The metal powder may be plastically deformed and firmly fixed on the exposed surface of the first semiconductor chip 121 mounted on the carrier 103. Accordingly, the first heat dissipation pattern 151 may not require a separate adhesive material, and may more effectively cover the first semiconductor chip 121. The generation of heat in the semiconductor package according to example embodiments may indicate that heat is generated in the semiconductor chips 121 and 122. For example, since the first heat dissipation pattern 151 is in contact with the first front surface FS1 that is the upper surface of the first semiconductor chip 121, and side surfaces of the second semiconductor chip 122, heat may be effectively discharged externally through the first heat dissipation pattern 151. In addition, the cold spray method has relatively low process costs, compared to sputtering methods, such that semiconductor packages having high yield may be produced at low cost.

Referring to FIG. 17B, in other embodiments the first heat dissipation pattern 151' may be formed by, for example, a cold spray method without forming the mask 148. The first heat dissipation pattern 151' may be formed at a level higher than the upper surface of the second semiconductor chip(s) 122 to cover the entire upper surface of the second semiconductor chip 122. After this manufacturing operation, the semiconductor package of FIG. 4 may be manufactured by performing a subsequent process.

Figure 18A:
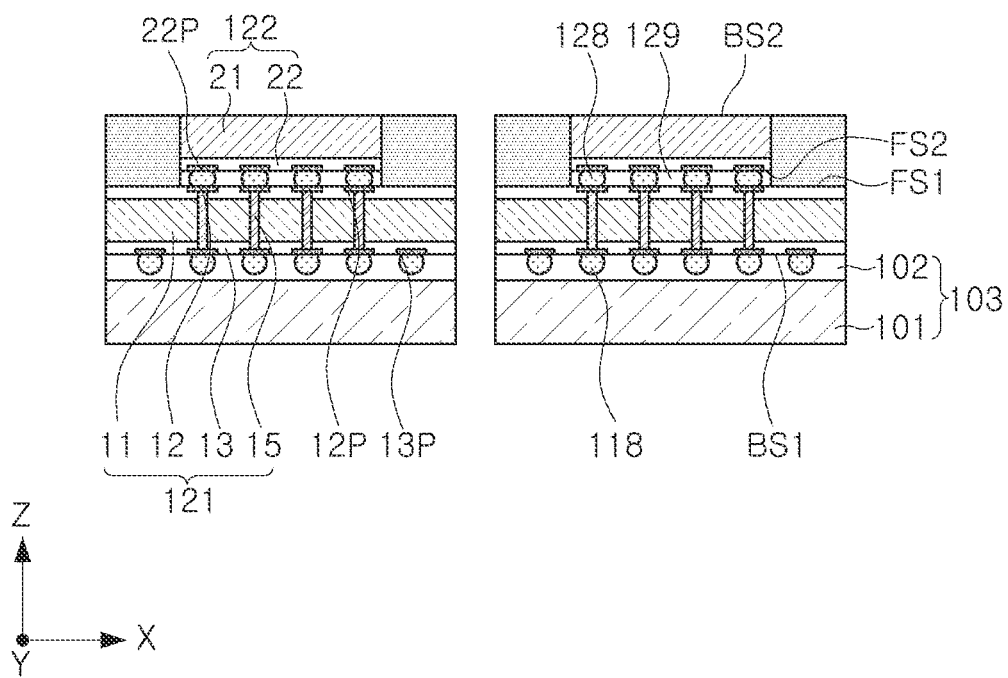

Referring to FIG. 18A, the semiconductor wafer 121W shown in FIG. 17A for example may be cut along the scribe lane SL to be divided into a plurality of first semiconductor chips 121. While cutting along the scribe lane SL, the first heat dissipation pattern 151 on the semiconductor wafer 121W may also be cut. Thereafter, the carrier 103 may be removed. Accordingly, a stacked chip structure including the first semiconductor chip 121 and the second semiconductor chip 122 may be formed.

Figure 18B:
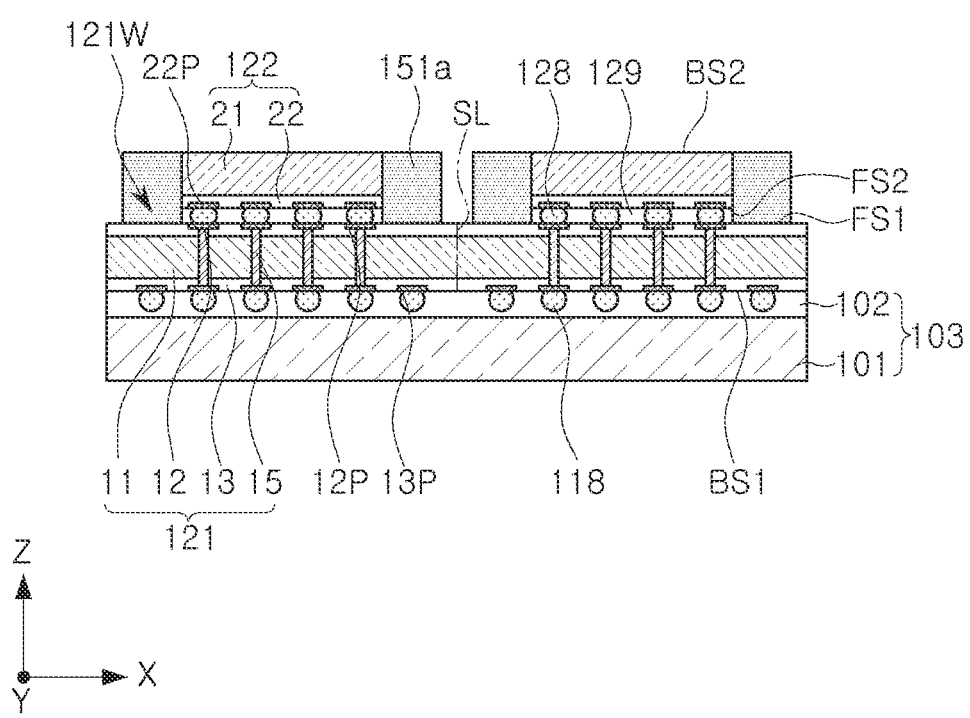

Referring to FIG. 18B, in other embodiments before cutting the semiconductor wafer 121W along the scribe lane SL, the first heat dissipation pattern 151a may be first cut. As the first heat dissipation pattern 151a is partially removed, an upper surface of the semiconductor wafer 121W may be partially exposed. Thereafter, the semiconductor wafer 121W may be cut along the scribe lane SL to separate the semiconductor wafer 121W into a plurality of first semiconductor chips 121. After this manufacturing operation, when a subsequent process is performed, the semiconductor package of FIG. 2 may be manufactured.

FIGS. 16 to 18B illustrate chip-on-wafer packaging methods in which a second semiconductor chip 122 is stacked on a semiconductor wafer 121W including a first semiconductor chip 121. However, the present inventive concepts are not limited thereto, and Chip-on-Chip or Wafer-on-Wafer packaging methods may also be used for example.

Figure 19:
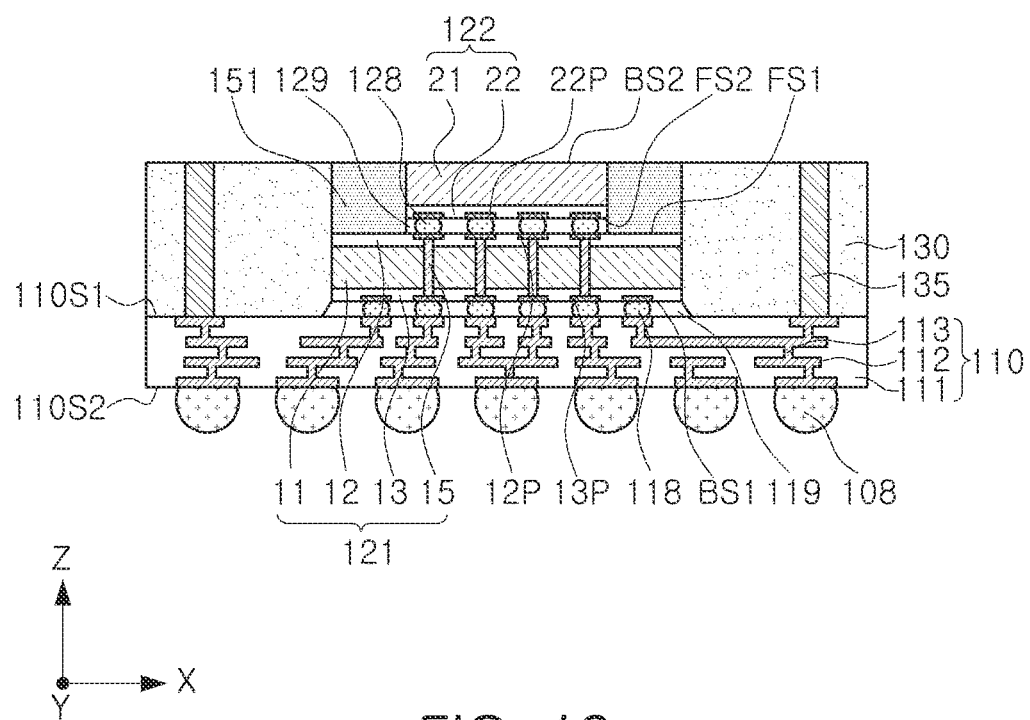

Referring to FIG. 19, a first interconnection structure 110 is prepared, and the stacked chip structure including a first semiconductor chip 121 and a second semiconductor chip 122 is mounted on the first interconnection structure 110. The first interconnection structure 110 may include, for example, an interposer. Forming the first interconnection structure 110 may include forming the first insulating layer 111, the first interconnection layers 112, and the first vias 113. First connection bumps 108 may be formed below the first interconnection structure 110. The first semiconductor chip 121 may be mounted on the first interconnection structure 110 by a flip-chip bonding method such that the back surface BS1, which is the lower surface, faces the upper surface 110S1 of the first interconnection structure 110. For example, the first back pads 13P of the first semiconductor chip 121 may be electrically connected to the first interconnection layers 112 of the first interconnection structure 110 through the second connection bumps 118.

Next, the encapsulant 130 may be formed on the first interconnection structure 110 to seal at least a portion of the stacked chip structure. The encapsulant 130 may be formed to expose or cover the upper surface of the first heat dissipation pattern 151 and a back surface BS2 that is the upper surface of the second semiconductor chip 122. The encapsulant 130 may include, or have formed therethrough, holes spaced apart from the stacked chip structure. Vertical connection structures 135 may be formed in the holes.

Thereafter, the semiconductor package 100 of FIGS. 1A and 1B may be manufactured by forming the second interconnection structure 140 on the encapsulant 130. The second interconnection structure 140 may include, for example, an interposer. Forming the second interconnection structure 140 may include forming the second insulating layer 141 and the second interconnection layers 142.

Figure 8B:
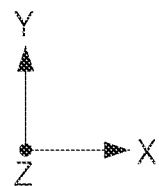
Figure 20:
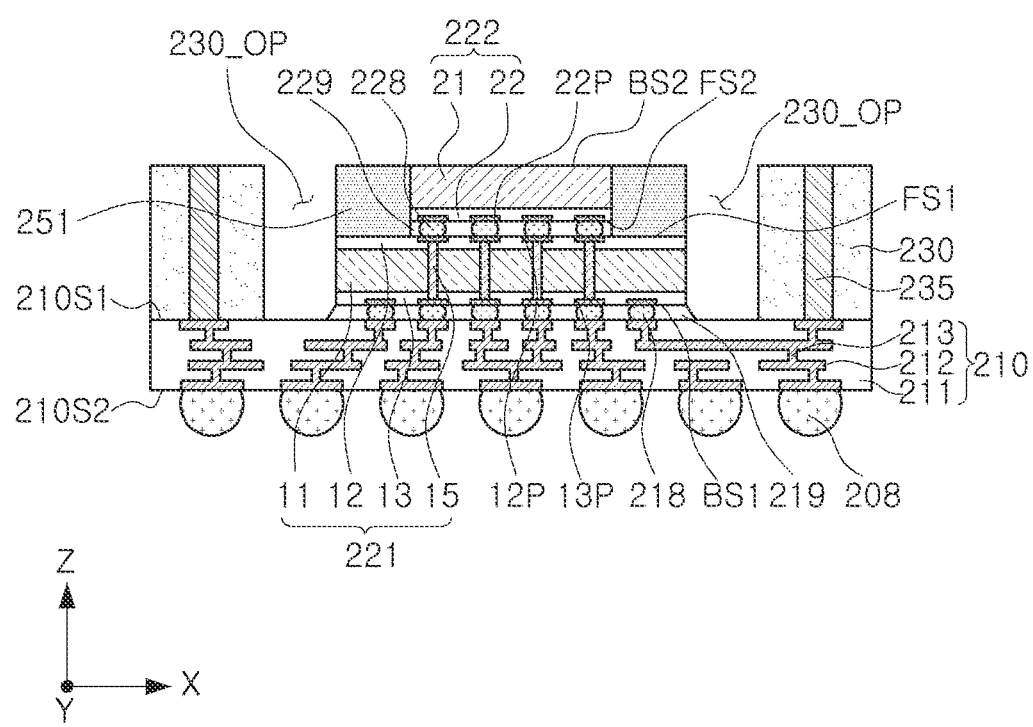

Referring to FIG. 20, and with further reference to FIG. 8 for example, in other embodiments, before forming the second interconnection structure 240, a portion of the encapsulant 230 may be removed to form an opening 230_OP. The opening 230_OP may be formed by forming a separate etch mask on the stacked chip structure and the encapsulant 230 and etching the encapsulant 230 using the etch mask. The opening 230_OP may expose side surfaces of the first semiconductor chip 221 and side surfaces of the first heat dissipation pattern 251.

Figure 21:
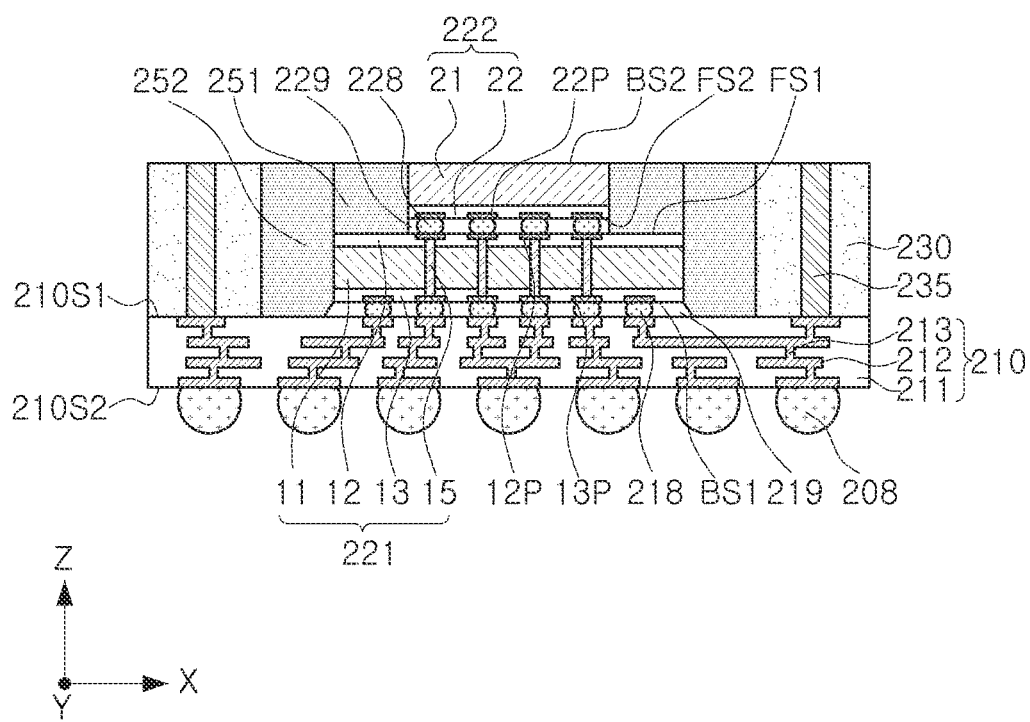

Referring to FIG. 21, a second heat dissipation pattern 252 filling at least a portion of the opening 230_OP of the encapsulant 230 may be formed. The second heat dissipation pattern 252 may be formed of the same material as the first heat dissipation pattern 251. The second heat dissipation pattern 252 may be formed by, for example, a cold spray method. Thereafter, the semiconductor package 200 of FIGS. 8A and 8B may be manufactured by forming the second interconnection structure 240 on the encapsulant 230.

As set forth above, semiconductor packages of the inventive concepts may include first and second heat dissipation patterns that are heat spreaders, in contact with side surfaces of a semiconductor chip and including a material having higher thermal conductivity than silicon.

Since the first heat dissipation pattern is disposed on the upper surface of the first semiconductor chip to surround the side surfaces of the second semiconductor chip, heat generated by the semiconductor chips may be radiated externally through a relatively larger area, thereby improving heat dissipation characteristics of the semiconductor package.

Since the second heat dissipation pattern is disposed to surround the side surfaces of the first semiconductor chip and the side surfaces of the first heat dissipation pattern, heat generated in the semiconductor chips may be radiated externally through a larger area, and thus heat dissipation characteristics of the semiconductor package may be improved.

While example embodiments have been illustrated and described above, it should be apparent to those skilled in the art that modifications and variations may be made without departing from the scope of the inventive concepts as defined by the appended claims.

What is claimed is:

1. A semiconductor package comprising:
a first interconnection structure including a first insulating layer and first interconnection layers;
a first semiconductor chip on the first interconnection structure;
a second semiconductor chip disposed on the first semiconductor chip and having a width smaller than a width of the first semiconductor chip;
a heat dissipation structure surrounding side surfaces of the second semiconductor chip, the heat dissipation structure on an upper surface of the first semiconductor chip and including a material having higher thermal conductivity than a thermal conductivity of silicon;
an encapsulant surrounding the first semiconductor chip and the heat dissipation structure, the encapsulant on the first interconnection structure; and
a second interconnection structure disposed on the encapsulant and the second semiconductor chip, and including a second insulating layer and second interconnection layers.

2. The semiconductor package of claim 1, wherein an upper surface of the heat dissipation structure is in contact with the second interconnection structure.

3. The semiconductor package of claim 1, wherein an upper surface of the heat dissipation structure is in contact with the encapsulant.

4. The semiconductor package of claim 1, wherein an upper surface of the second semiconductor chip is in contact with the second interconnection structure.

5. The semiconductor package of claim 1, wherein the first semiconductor chip comprises a first semiconductor layer and through-vias passing through the first semiconductor layer.

6. The semiconductor package of claim 1, wherein an outer side surface of the heat dissipation structure vertically overlaps the first semiconductor chip.

7. The semiconductor package of claim 1, wherein the encapsulant covers an upper surface of the heat dissipation structure and an upper surface of the second semiconductor chip.

8. The semiconductor package of claim 1, wherein the heat dissipation structure is in contact with an upper surface of the second semiconductor chip.

9. The semiconductor package of claim 1, wherein the second interconnection structure has an opening provided with a step portion exposing a portion of an upper surface of at least one interconnection layer among the second interconnection layers, and an upper heat dissipation pattern disposed in the opening of the second interconnection structure,
the upper heat dissipation pattern passing through the encapsulant and in contact with at least a portion of an upper surface of the second semiconductor chip, and including a material having higher thermal conductivity than the thermal conductivity of silicon,
wherein the upper heat dissipation pattern includes a lower portion having a first width, and an upper portion disposed on the lower portion and having a second width greater than the first width, and
the upper portion of the upper heat dissipation pattern is in contact with the exposed portion of the upper surface of the at least one interconnection layer.

10. A semiconductor package comprising:
a first interconnection structure;
a first semiconductor chip on the first interconnection structure;
a second semiconductor chip disposed on the first semiconductor chip and having a width smaller than a width of the first semiconductor chip;
a first heat dissipation pattern surrounding side surfaces of the second semiconductor chip, the first heat dissipation pattern on an upper surface of the first semiconductor chip, and including a material having higher thermal conductivity than a thermal conductivity of silicon;
a second heat dissipation pattern surrounding side surfaces of the first semiconductor chip and side surfaces of the first heat dissipation pattern, the second heat dissipation pattern on the first interconnection structure and including a material having higher thermal conductivity than the thermal conductivity of silicon; and
an encapsulant surrounding side surfaces of the second heat dissipation pattern, the encapsulant on the first interconnection structure.

11. The semiconductor package of claim 10, wherein a lower surface of the second heat dissipation pattern is positioned at a lower level than a lower surface of the first semiconductor chip.

12. The semiconductor package of claim 10, wherein an interface between the first heat dissipation pattern and the second heat dissipation pattern overlaps the first semiconductor chip in a vertical direction.

13. The semiconductor package of claim 10, wherein the encapsulant covers an upper surface of the first heat dissipation pattern, an upper surface of the second heat dissipation pattern, and an upper surface of the second semiconductor chip.

14. The semiconductor package of claim 10, further comprising:
a second interconnection structure on the second semiconductor chip, and including an upper heat dissipation pattern penetrating through the second interconnection structure and the encapsulant, and in contact with at least a portion of an upper surface of the second semiconductor chip, the upper heat dissipation pattern including a material having thermal conductivity higher than the thermal conductivity of silicon,
wherein the second interconnection structure includes a plurality of interconnection layers, and has an opening provided with a step portion exposing a portion of an upper surface of at least one interconnection layer among the plurality of interconnection layers,
the upper heat dissipation pattern includes a lower portion having a first width, and an upper portion disposed on the lower portion and having a second width greater than the first width, and
the upper portion of the upper heat dissipation pattern is in contact with the exposed portion of the upper surface of the at least one interconnection layer.

15. A semiconductor package comprising:
a first interconnection structure;
a first semiconductor chip disposed on the first interconnection structure and including a plurality of through-vias and first pads connected to the plurality of through-vias;
a second semiconductor chip disposed on the first interconnection structure and including second pads electrically connected to the first pads, the second semiconductor chip having a size different than a size of the first semiconductor chip;
a heat dissipation structure contacting and surrounding side surfaces of at least one of the first semiconductor chip and the second semiconductor chip, and including a material having higher thermal conductivity than a thermal conductivity of silicon; and an encapsulant surrounding side surfaces of the heat dissipating structure.

16. The semiconductor package of claim 15, wherein the encapsulant is in contact with an upper surface of the heat dissipation structure and an upper surface of the second semiconductor chip.

17. The semiconductor package of claim 15, wherein the heat dissipation structure includes a first heat dissipation pattern, and a second heat dissipation pattern surrounding the first heat dissipation pattern and having a thickness greater than a thickness of the first heat dissipation pattern.

18. The semiconductor package of claim 17, wherein the second heat dissipation pattern is in contact with an upper surface of the first interconnection structure.

19. The semiconductor package of claim 15, wherein the second semiconductor chip includes a plurality of second semiconductor chips having a width smaller than a width of the first semiconductor chip, the plurality of second semiconductor chips stacked on the first semiconductor chip, and the heat dissipation structure surrounds all side surfaces of the plurality of second semiconductor chips.

20. The semiconductor package of claim 19, wherein the heat dissipation structure includes a first heat dissipation pattern contacting side surfaces of each of the plurality of second semiconductor chips, and a second heat dissipation pattern surrounding the first heat dissipation pattern and contacting side surfaces of the first semiconductor chip.

* * * * *